(12) United States Patent
Kitamura et al.

(10) Patent No.: US 8,725,463 B2
(45) Date of Patent: May 13, 2014

(54) FREQUENCY SPECTRUM ANALYZING APPARATUS

(75) Inventors: Natsuko Kitamura, Wako (JP); Yoshiaki Akimoto, Wako (JP); Jiro Takagi, Wako (JP); Atsushi Kurauchi, Wako (JP); Masayuki Yoshiiri, Wako (JP); Hirotaka Komatsu, Wako (JP); Kazuhiko Hirota, Wako (JP); Makoto Murakami, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 630 days.

(21) Appl. No.: 13/120,433

(22) PCT Filed: Sep. 9, 2009

(86) PCT No.: PCT/JP2009/065696
§ 371 (c)(1),
(2), (4) Date: Mar. 23, 2011

(87) PCT Pub. No.: WO2010/035634
PCT Pub. Date: Apr. 1, 2010

(65) Prior Publication Data
US 2011/0178750 A1    Jul. 21, 2011

(30) Foreign Application Priority Data

Sep. 26, 2008  (JP) .................... 2008-247658

(51) Int. Cl.
| G01R 23/16 | (2006.01) |
| G06F 17/00 | (2006.01) |
| G06F 19/00 | (2011.01) |
| G01L 23/22 | (2006.01) |
| G05B 15/00 | (2006.01) |

(52) U.S. Cl.
CPC ............. *G01R 23/16* (2013.01); *G06F 17/00* (2013.01); *G06F 19/00* (2013.01); *G01L 23/221* (2013.01); *G05B 15/00* (2013.01)
USPC ....... 702/189; 73/35.01; 73/114.01; 701/101; 702/1; 702/127; 702/187; 708/200

(58) Field of Classification Search
CPC .......... G01D 7/00; G01D 9/00; G01D 21/00; G01L 23/00; G01L 23/22; G01L 23/221; G01L 23/225; G01L 2023/22; G01M 15/00; G01M 15/04; G01M 15/05; G01M 15/06; G01M 15/11; G01M 15/12; G01R 23/00; G01R 23/16; G05B 15/00; G06F 11/00; G06F 11/32; G06F 11/34; G06F 17/00; G06F 17/40; G06F 19/00
USPC ........ 73/35.01, 114.01, 114.02, 432.1, 865.8, 73/865.9; 431/13; 700/1, 28, 90, 304; 701/1, 31.6, 31.8, 31.9, 32.9, 99, 101, 701/102, 111; 702/1, 33, 57, 66, 75, 76, 702/127, 182, 187, 189; 708/100, 105, 200, 708/400, 402, 403, 404, 405
See application file for complete search history.

(56) References Cited

U.S. PATENT DOCUMENTS

| 2,787,760 | A | * | 4/1957 | Vehslage et al. .............. 324/379 |
| 2,867,766 | A | * | 1/1959 | Broder et al. .................. 324/379 |
| 3,287,965 | A | * | 11/1966 | Brahm et al. ............... 73/112.03 |
| 3,485,093 | A | * | 12/1969 | Muller et al. ............... 73/114.02 |
| 3,517,173 | A | * | 6/1970 | Shively et al. ................. 708/404 |
| 4,305,254 | A | * | 12/1981 | Kawakatsu et al. ............. 60/716 |
| 4,407,132 | A | * | 10/1983 | Kawakatsu et al. ............. 60/716 |
| 5,206,809 | A | | 4/1993 | Iwakiri et al. |
| 5,394,330 | A | | 2/1995 | Horner |
| 6,246,952 | B1 | | 6/2001 | Honda |
| 2003/0164156 | A1 | | 9/2003 | Galtier |
| 2004/0194536 | A1 | | 10/2004 | Honda |
| 2011/0276293 | A1* | | 11/2011 | Kitamura et al. ............... 702/76 |
| 2012/0290195 | A1* | | 11/2012 | Irie et al. ....................... 701/104 |

FOREIGN PATENT DOCUMENTS

| JP | 04-309871 | 11/1992 |
| JP | 06-258192 | 9/1994 |
| JP | 06281523  A | 10/1994 |
| JP | 11-295188 | 10/1999 |
| JP | 11-303673 | 11/1999 |
| JP | 11-315752 | 11/1999 |

| JP | 2000-227013 A | 8/2000 |
| JP | 2005-90250 | 4/2005 |
| JP | 2008-025418 A | 2/2008 |

OTHER PUBLICATIONS

International Search Report, PCT/JP2009/065696, Nov. 2, 2009, a total of 2 pages.
European Search Report application No. EP09816050 dated Jul. 27, 2011.

* cited by examiner (Continued)

*Primary Examiner* — Edward Cosimano
(74) *Attorney, Agent, or Firm* — Squire Sanders (US) LLP

(57) ABSTRACT

A frequency spectrum analyzing apparatus for performing a frequency spectrum analysis with respect to a detected value of an operating parameter of an internal combustion engine in synchronism with rotation of the engine, is provided. The operating parameter is sampled at predetermined time intervals, and a sampled value is converted to a digital value. Intensities of first and second elements are calculated with respect to a predetermined number of the sampled values. The first elements and second elements respectively correspond to a plurality of frequency components contained in the detected value, and a phase of the second element differs from a phase of the first element by 90 degrees. Frequency component intensities corresponding to the plurality of frequency components are calculated in synchronism with rotation of the engine, using the first element intensities and the second element intensities. The frequency component intensities are calculated by replacing a part of an integrated value of the first element intensities, and a part of an integrated value of the second element intensities respectively with corresponding preceding calculated values, when an rotational speed of the engine is higher than or equal to a set threshold value.

8 Claims, 17 Drawing Sheets

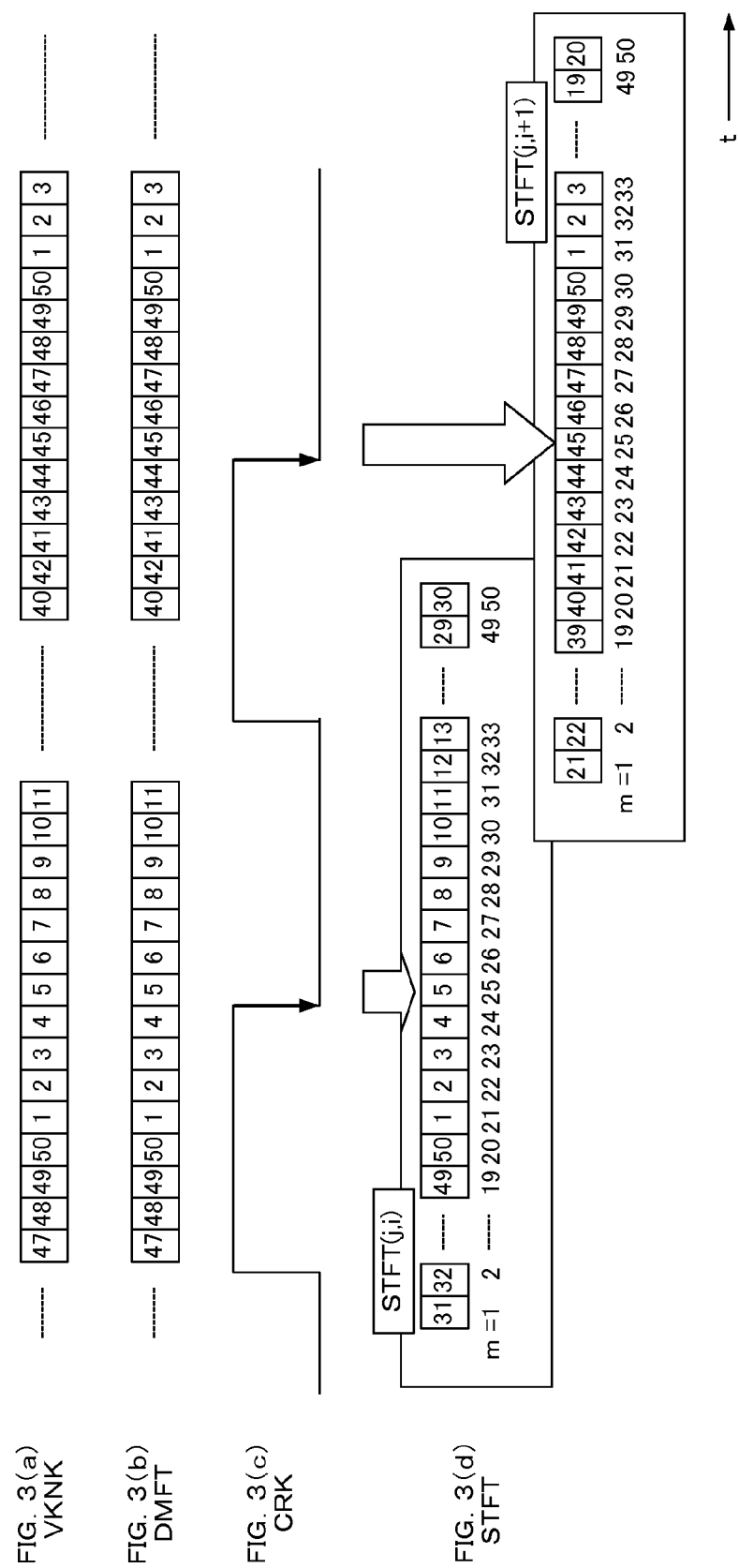

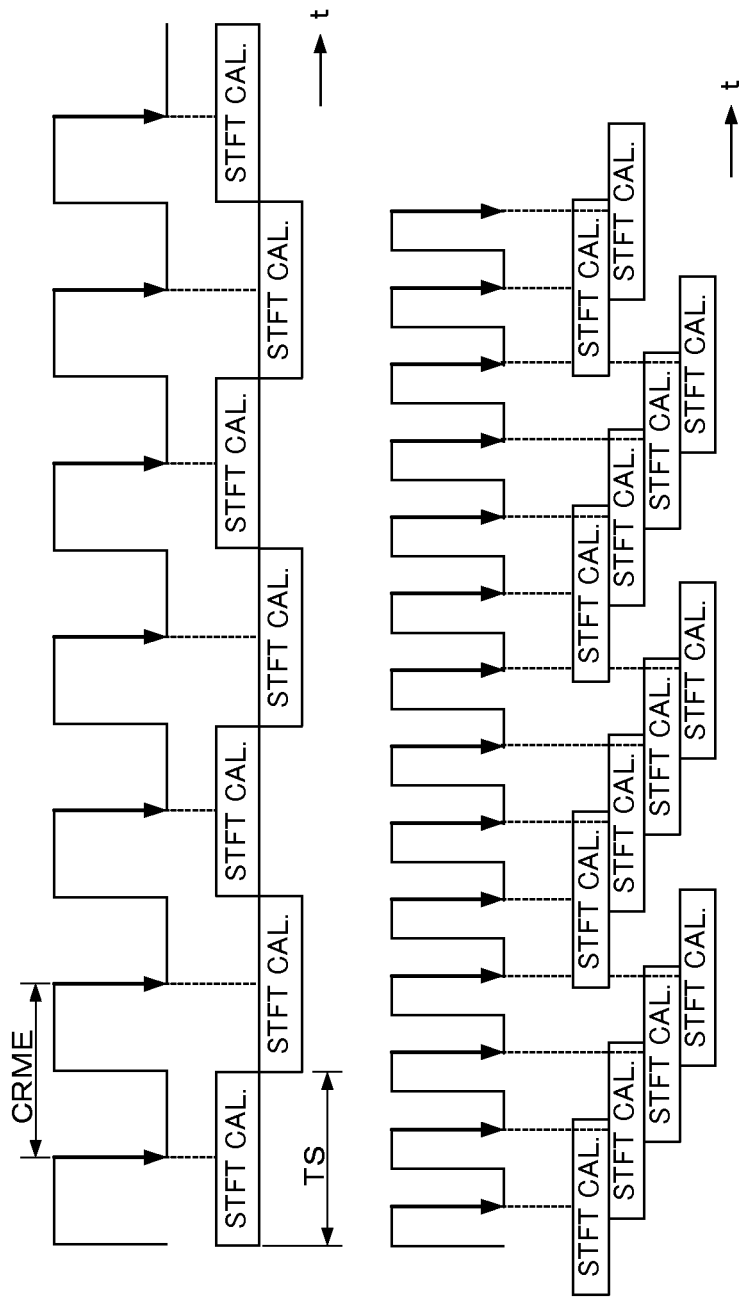
FIG. 4(a) CRK
FIG. 4(b) CRK

FIG. 7(a)

| FREQUENCY | CRANK ANGLE | | | | | | | | | | | | | | |
|---|---|---|---|---|---|---|---|---|---|---|---|---|---|---|---|
| | | 6 | 12 | 18 | 24 | 30 | 36 | 42 | 48 | 54 | 60 | 66 | 72 | 78 | 84 | 90 |
| | 25 | 56 | 56 | 24 | 30 | 24 | 26 | 26 | 26 | 26 | 26 | 30 | 30 | 44 | 44 | 30 |
| | 24 | 66 | 66 | 24 | 44 | 24 | 24 | 44 | 24 | 24 | 24 | 44 | 44 | 43 | 43 | 44 |
| | 23 | 78 | 78 | 52 | 43 | 34 | 24 | 43 | 24 | 34 | 24 | 43 | 43 | 41 | 44 | 43 |
| | 22 | 67 | 67 | 67 | 41 | 43 | 43 | 41 | 34 | 35 | 34 | 24 | 41 | 30 | 43 | 41 |
| | 21 | 80 | 80 | 66 | 66 | 41 | 43 | 30 | 35 | 36 | 35 | 24 | 24 | 24 | 41 | 30 |
| | 20 | 77 | 77 | 43 | 60 | 56 | 41 | 43 | 36 | 43 | 36 | 34 | 24 | 24 | 30 | 24 |
| | 19 | 66 | 66 | 41 | 43 | 67 | 53 | 41 | 43 | 32 | 43 | 35 | 34 | 34 | 24 | 24 |
| | 18 | 56 | 56 | 43 | 41 | 43 | 53 | 34 | 43 | 31 | 32 | 36 | 35 | 35 | 24 | 34 |
| | 17 | 60 | 60 | 60 | 60 | 41 | 52 | 52 | 41 | 25 | 31 | 43 | 36 | 36 | 34 | 35 |
| | 16 | 64 | 64 | 66 | 66 | 60 | 43 | 51 | 51 | 43 | 25 | 32 | 43 | 43 | 35 | 36 |
| | 15 | 62 | 62 | 43 | 32 | 64 | 56 | 43 | 51 | 34 | 43 | 31 | 32 | 32 | 36 | 43 |
| | 14 | 60 | 60 | 41 | 32 | 43 | 56 | 56 | 51 | 52 | 34 | 25 | 31 | 31 | 43 | 32 |
| | 13 | 58 | 58 | 56 | 43 | 41 | 43 | 54 | 51 | 50 | 43 | 43 | 25 | 25 | 32 | 31 |
| | 12 | 66 | 66 | 57 | 60 | 32 | 41 | 43 | 43 | 53 | 52 | 34 | 43 | 43 | 31 | 25 |
| | 11 | 76 | 76 | 62 | 62 | 67 | 32 | 41 | 41 | 43 | 51 | 52 | 34 | 34 | 25 | 43 |
| | 10 | 66 | 66 | 43 | 43 | 56 | 65 | 67 | 32 | 41 | 50 | 51 | 43 | 43 | 43 | 34 |
| | 9 | 57 | 57 | 43 | 41 | 43 | 64 | 64 | 56 | 32 | 32 | 50 | 51 | 40 | 34 | 43 |
| | 8 | 53 | 53 | 41 | 41 | 41 | 32 | 67 | 55 | 53 | 32 | 50 | 51 | 51 | 43 | 40 |
| | 7 | 66 | 66 | 75 | 68 | 70 | 68 | 69 | 70 | 67 | 66 | 63 | 64 | 62 | 52 | 38 |
| | 6 | 76 | 76 | 75 | 68 | 70 | 68 | 69 | 70 | 67 | 66 | 63 | 64 | 62 | 60 | 60 |
| | 5 | 34 | 35 | 30 | 44 | 43 | 41 | 30 | 24 | 24 | 34 | 35 | 36 | 43 | 32 | 31 |

FIG. 7(b)

| FREQUENCY | CRANK ANGLE | | | | | | | | | | | | | | |
|---|---|---|---|---|---|---|---|---|---|---|---|---|---|---|---|
| | | 6 | 12 | 18 | 24 | 30 | 36 | 42 | 48 | 54 | 60 | 66 | 72 | 78 | 84 | 90 |
| | 25 | 1 | 1 | 0 | 0 | 0 | 0 | 0 | 0 | 0 | 0 | 0 | 0 | 0 | 0 | 0 |
| | 24 | 1 | 1 | 0 | 0 | 0 | 0 | 0 | 0 | 0 | 0 | 0 | 0 | 0 | 0 | 0 |
| | 23 | 1 | 1 | 1 | 0 | 0 | 0 | 0 | 0 | 0 | 0 | 0 | 0 | 0 | 0 | 0 |
| | 22 | 1 | 1 | 1 | 0 | 0 | 0 | 0 | 0 | 0 | 0 | 0 | 0 | 0 | 0 | 0 |
| | 21 | 1 | 1 | 1 | 1 | 0 | 0 | 0 | 0 | 0 | 0 | 0 | 0 | 0 | 0 | 0 |
| | 20 | 1 | 1 | 0 | 0 | 1 | 0 | 0 | 0 | 0 | 0 | 0 | 0 | 0 | 0 | 0 |
| | 19 | 1 | 1 | 0 | 0 | 1 | 1 | 0 | 0 | 0 | 0 | 0 | 0 | 0 | 0 | 0 |
| | 18 | 1 | 1 | 0 | 0 | 0 | 1 | 1 | 0 | 0 | 0 | 0 | 0 | 0 | 0 | 0 |
| | 17 | 1 | 1 | 1 | 1 | 0 | 1 | 1 | 0 | 0 | 0 | 0 | 0 | 0 | 0 | 0 |
| | 16 | 1 | 1 | 1 | 1 | 1 | 0 | 1 | 1 | 0 | 0 | 0 | 0 | 0 | 0 | 0 |
| | 15 | 1 | 1 | 0 | 0 | 1 | 1 | 0 | 1 | 0 | 0 | 0 | 0 | 0 | 0 | 0 |
| | 14 | 1 | 1 | 0 | 0 | 0 | 1 | 1 | 1 | 1 | 0 | 0 | 0 | 0 | 0 | 0 |
| | 13 | 1 | 1 | 1 | 0 | 0 | 0 | 1 | 1 | 1 | 0 | 0 | 0 | 0 | 0 | 0 |
| | 12 | 1 | 1 | 1 | 1 | 0 | 0 | 0 | 0 | 1 | 1 | 0 | 0 | 0 | 0 | 0 |
| | 11 | 1 | 1 | 1 | 1 | 1 | 0 | 0 | 0 | 0 | 1 | 1 | 0 | 0 | 0 | 0 |
| | 10 | 1 | 1 | 0 | 0 | 1 | 1 | 1 | 0 | 0 | 1 | 1 | 0 | 0 | 0 | 0 |
| | 9 | 1 | 1 | 0 | 0 | 0 | 1 | 1 | 1 | 0 | 0 | 1 | 1 | 0 | 0 | 0 |
| | 8 | 1 | 1 | 0 | 0 | 0 | 0 | 1 | 1 | 1 | 0 | 1 | 1 | 1 | 0 | 0 |
| | 7 | 1 | 1 | 1 | 1 | 1 | 1 | 1 | 1 | 1 | 1 | 1 | 1 | 1 | 1 | 0 |
| | 6 | 1 | 1 | 1 | 1 | 1 | 1 | 1 | 1 | 1 | 1 | 1 | 1 | 1 | 1 | 1 |
| | 5 | 0 | 0 | 0 | 0 | 0 | 0 | 0 | 0 | 0 | 0 | 0 | 0 | 0 | 0 | 0 |

FIG. 8

| | | \multicolumn{15}{c}{CRANK ANGLE} |
|---|---|---|---|---|---|---|---|---|---|---|---|---|---|---|---|
| | | 6 | 12 | 18 | 24 | 30 | 36 | 42 | 48 | 54 | 60 | 66 | 72 | 78 | 84 | 90 |
| FREQUENCY | 25 | ▨ | 0 | 0 | 0 | 0 | 0 | 0 | ▨ | 0 | 0 | 0 | 0 | 0 | 0 | 0 |
| | 24 | ▨ | 0 | 0 | 0 | 0 | 0 | 0 | ▨ | 0 | 0 | 0 | 0 | 0 | 0 | 0 |
| | 23 | ▨ | 0 | 0 | 0 | 0 | 0 | 0 | ▨ | 0 | 0 | 0 | 0 | 0 | 0 | 0 |
| | 22 | ▨ | 0 | 0 | 0 | 0 | 0 | 0 | ▨ | 0 | 0 | 0 | 0 | 0 | 0 | 0 |
| | 21 | ▨ | 0 | 0 | 0 | 0 | 0 | 0 | ▨ | 0 | 0 | 0 | 0 | 0 | 0 | 0 |
| | 20 | ▨ | 0 | 0 | 0 | 0 | 0 | 0 | ▨ | 0 | 0 | 0 | 0 | 0 | 0 | 0 |
| | 19 | ▨ | 0 | 0 | 0 | 0 | 0 | 0 | ▨ | 0 | 0 | 0 | 0 | 0 | 0 | 0 |
| | 18 | ▨ | 0 | 0 | 0 | 0 | 0 | 0 | ▨ | 0 | 0 | 0 | 0 | 0 | 0 | 0 |
| | 17 | ▨ | 0 | 0 | 0 | 0 | 0 | 0 | ▨ | 0 | 0 | 0 | 0 | 0 | 0 | 0 |
| | 16 | ▨ | 0 | 0 | 0 | 0 | 0 | 0 | ▨ | 0 | 0 | 0 | 0 | 0 | 0 | 0 |
| | 15 | ▨ | 0 | 0 | 0 | 0 | 0 | 0 | ▨ | 0 | 0 | 0 | 0 | 0 | 0 | 0 |
| | 14 | ▨ | 0 | 0 | 0 | 0 | 0 | 0 | ▨ | 0 | 0 | 0 | 0 | 0 | 0 | 0 |
| | 13 | ▨ | 0 | 0 | 0 | 0 | 0 | 0 | ▨ | 0 | 0 | 0 | 0 | 0 | 0 | 0 |
| | 12 | ▨ | 0 | 0 | 0 | 0 | 0 | 0 | ▨ | 0 | 0 | 0 | 0 | 0 | 0 | 0 |
| | 11 | ▨ | 0 | 0 | 0 | 0 | 0 | 0 | ▨ | 0 | 0 | 0 | 0 | 0 | 0 | 0 |
| | 10 | ▨ | 0 | 0 | 0 | 0 | 0 | 0 | ▨ | 0 | 0 | 0 | 0 | 0 | 0 | 0 |
| | 9 | ▨ | 0 | 0 | 0 | 0 | 0 | 0 | ▨ | 0 | 0 | 0 | 0 | 0 | 0 | 0 |
| | 8 | ▨ | 0 | 0 | 0 | 0 | 0 | 0 | ▨ | 0 | 0 | 0 | 0 | 0 | 0 | 0 |
| | 7 | ▨ | 0 | 0 | 0 | 0 | 0 | 0 | ▨ | 0 | 0 | 0 | 0 | 0 | 0 | 0 |
| | 6 | ▨ | 0 | 0 | 0 | 0 | 0 | 0 | ▨ | 0 | 0 | 0 | 0 | 0 | 0 | 0 |
| | 5 | 0 | 0 | 0 | 0 | 0 | 0 | 0 | 0 | 0 | 0 | 0 | 0 | 0 | 0 | 0 |

FIG. 9(a)

| FREQUENCY \ CRANK ANGLE | 6 | 12 | 18 | 24 | 30 | 36 | 42 | 48 | 54 | 60 | 66 | 72 | 78 | 84 | 90 |
|---|---|---|---|---|---|---|---|---|---|---|---|---|---|---|---|
| 25 | 1 | 0 | 0 | 0 | 0 | 0 | 0 | 0 | 0 | 0 | 0 | 0 | 0 | 0 | 0 |
| 24 | 1 | 0 | 0 | 0 | 0 | 0 | 0 | 0 | 0 | 0 | 0 | 0 | 0 | 0 | 0 |
| 23 | 1 | 0 | 0 | 0 | 0 | 0 | 0 | 0 | 0 | 0 | 0 | 0 | 0 | 0 | 0 |
| 22 | 1 | 0 | 0 | 0 | 0 | 0 | 0 | 0 | 0 | 0 | 0 | 0 | 0 | 0 | 0 |
| 21 | 1 | 0 | 0 | 0 | 0 | 0 | 0 | 0 | 0 | 0 | 0 | 0 | 0 | 0 | 0 |
| 20 | 1 | 0 | 0 | 0 | 0 | 0 | 0 | 0 | 0 | 0 | 0 | 0 | 0 | 0 | 0 |
| 19 | 1 | 0 | 0 | 0 | 0 | 0 | 0 | 0 | 0 | 0 | 0 | 0 | 0 | 0 | 0 |
| 18 | 1 | 0 | 0 | 0 | 0 | 0 | 0 | 0 | 0 | 0 | 0 | 0 | 0 | 0 | 0 |
| 17 | 1 | 0 | 0 | 0 | 0 | 0 | 0 | 0 | 0 | 0 | 0 | 0 | 0 | 0 | 0 |
| 16 | 1 | 0 | 0 | 0 | 0 | 0 | 0 | 0 | 0 | 0 | 0 | 0 | 0 | 0 | 0 |
| 15 | 1 | 0 | 0 | 0 | 0 | 0 | 0 | 0 | 0 | 0 | 0 | 0 | 0 | 0 | 0 |
| 14 | 1 | 0 | 0 | 0 | 0 | 0 | 0 | 0 | 0 | 0 | 0 | 0 | 0 | 0 | 0 |
| 13 | 1 | 0 | 0 | 0 | 0 | 0 | 0 | 0 | 0 | 0 | 0 | 0 | 0 | 0 | 0 |
| 12 | 1 | 0 | 0 | 0 | 0 | 0 | 0 | 0 | 0 | 0 | 0 | 0 | 0 | 0 | 0 |
| 11 | 1 | 0 | 0 | 0 | 0 | 0 | 0 | 0 | 0 | 0 | 0 | 0 | 0 | 0 | 0 |
| 10 | 1 | 0 | 0 | 0 | 0 | 0 | 0 | 0 | 0 | 0 | 0 | 0 | 0 | 0 | 0 |
| 9 | 1 | 0 | 0 | 0 | 0 | 0 | 0 | 0 | 0 | 0 | 0 | 0 | 0 | 0 | 0 |
| 8 | 1 | 0 | 0 | 0 | 0 | 0 | 0 | 0 | 0 | 0 | 0 | 0 | 0 | 0 | 0 |
| 7 | 1 | 0 | 0 | 0 | 0 | 0 | 0 | 0 | 0 | 0 | 0 | 0 | 0 | 0 | 0 |
| 6 | 1 | 0 | 0 | 0 | 0 | 0 | 0 | 0 | 0 | 0 | 0 | 0 | 0 | 0 | 0 |
| 5 | 0 | 0 | 0 | 0 | 0 | 0 | 0 | 0 | 0 | 0 | 0 | 0 | 0 | 0 | 0 |

FIG. 9(b)

| FREQUENCY \ CRANK ANGLE | 6 | 12 | 18 | 24 | 30 | 36 | 42 | 48 | 54 | 60 | 66 | 72 | 78 | 84 | 90 |
|---|---|---|---|---|---|---|---|---|---|---|---|---|---|---|---|
| 25 | 0 | 1 | 0 | 0 | 0 | 0 | 0 | 0 | 0 | 0 | 0 | 0 | 0 | 0 | 0 |
| 24 | 0 | 1 | 0 | 0 | 0 | 0 | 0 | 0 | 0 | 0 | 0 | 0 | 0 | 0 | 0 |
| 23 | 0 | 1 | 1 | 0 | 0 | 0 | 0 | 0 | 0 | 0 | 0 | 0 | 0 | 0 | 0 |
| 22 | 0 | 1 | 1 | 0 | 0 | 0 | 0 | 0 | 0 | 0 | 0 | 0 | 0 | 0 | 0 |
| 21 | 0 | 1 | 1 | 1 | 0 | 0 | 0 | 0 | 0 | 0 | 0 | 0 | 0 | 0 | 0 |
| 20 | 0 | 1 | 0 | 1 | 1 | 0 | 0 | 0 | 0 | 0 | 0 | 0 | 0 | 0 | 0 |
| 19 | 0 | 1 | 0 | 0 | 1 | 1 | 0 | 0 | 0 | 0 | 0 | 0 | 0 | 0 | 0 |
| 18 | 0 | 1 | 0 | 0 | 0 | 1 | 1 | 0 | 0 | 0 | 0 | 0 | 0 | 0 | 0 |
| 17 | 0 | 1 | 1 | 1 | 0 | 1 | 1 | 0 | 0 | 0 | 0 | 0 | 0 | 0 | 0 |
| 16 | 0 | 1 | 1 | 1 | 1 | 0 | 1 | 0 | 0 | 0 | 0 | 0 | 0 | 0 | 0 |
| 15 | 0 | 1 | 0 | 0 | 1 | 1 | 0 | 1 | 0 | 0 | 0 | 0 | 0 | 0 | 0 |
| 14 | 0 | 1 | 0 | 0 | 0 | 1 | 1 | 1 | 0 | 0 | 0 | 0 | 0 | 0 | 0 |
| 13 | 0 | 1 | 1 | 0 | 0 | 0 | 1 | 1 | 0 | 0 | 0 | 0 | 0 | 0 | 0 |
| 12 | 0 | 1 | 1 | 1 | 0 | 0 | 0 | 1 | 1 | 0 | 0 | 0 | 0 | 0 | 0 |
| 11 | 0 | 1 | 1 | 1 | 1 | 0 | 0 | 0 | 1 | 1 | 0 | 0 | 0 | 0 | 0 |
| 10 | 0 | 1 | 0 | 0 | 1 | 1 | 0 | 0 | 1 | 1 | 0 | 0 | 0 | 0 | 0 |
| 9 | 0 | 1 | 0 | 0 | 1 | 1 | 0 | 0 | 1 | 1 | 0 | 0 | 0 | 0 | 0 |
| 8 | 0 | 1 | 0 | 0 | 0 | 1 | 1 | 0 | 0 | 1 | 1 | 0 | 0 | 0 | 0 |
| 7 | 0 | 1 | 1 | 1 | 1 | 1 | 1 | 1 | 1 | 1 | 1 | 1 | 1 | 1 | 0 |
| 6 | 0 | 1 | 1 | 1 | 1 | 1 | 1 | 1 | 1 | 1 | 1 | 1 | 1 | 1 | 1 |
| 5 | 0 | 0 | 0 | 0 | 0 | 0 | 0 | 0 | 0 | 0 | 0 | 0 | 0 | 0 | 0 |

FIG. 10(a)

| | | CRANK ANGLE | | | | | | | | | | | | | | |
|---|---|---|---|---|---|---|---|---|---|---|---|---|---|---|---|---|
| | | 6 | 12 | 18 | 24 | 30 | 36 | 42 | 48 | 54 | 60 | 66 | 72 | 78 | 84 | 90 |
| FREQUENCY | 25 | 0 | 1 | 0 | 0 | 0 | 0 | 0 | 0 | 0 | 0 | 0 | 0 | 0 | 0 | 0 |
| | 24 | 0 | 1 | 0 | 0 | 0 | 0 | 0 | 0 | 0 | 0 | 0 | 0 | 0 | 0 | 0 |
| | 23 | 0 | 1 | 1 | 0 | 0 | 0 | 0 | 0 | 0 | 0 | 0 | 0 | 0 | 0 | 0 |
| | 22 | 0 | 1 | 1 | 0 | 0 | 0 | 0 | 0 | 0 | 0 | 0 | 0 | 0 | 0 | 0 |
| | 21 | 0 | 1 | 1 | 1 | 0 | 0 | 0 | 0 | 0 | 0 | 0 | 0 | 0 | 0 | 0 |
| | 20 | 0 | 1 | 1 | 1 | 1 | 0 | 0 | 0 | 0 | 0 | 0 | 0 | 0 | 0 | 0 |
| | 19 | 0 | 1 | 1 | 1 | 1 | 0 | 0 | 0 | 0 | 0 | 0 | 0 | 0 | 0 | 0 |
| | 18 | 0 | 1 | 1 | 1 | 1 | 1 | 0 | 0 | 0 | 0 | 0 | 0 | 0 | 0 | 0 |
| | 17 | 0 | 1 | 1 | 1 | 1 | 1 | 0 | 0 | 0 | 0 | 0 | 0 | 0 | 0 | 0 |
| | 16 | 0 | 1 | 1 | 1 | 1 | 1 | 1 | 0 | 0 | 0 | 0 | 0 | 0 | 0 | 0 |
| | 15 | 0 | 1 | 1 | 1 | 1 | 1 | 1 | 0 | 0 | 0 | 0 | 0 | 0 | 0 | 0 |
| | 14 | 0 | 1 | 1 | 1 | 1 | 1 | 1 | 1 | 0 | 0 | 0 | 0 | 0 | 0 | 0 |
| | 13 | 0 | 1 | 1 | 1 | 1 | 1 | 1 | 1 | 0 | 0 | 0 | 0 | 0 | 0 | 0 |
| | 12 | 0 | 1 | 1 | 1 | 1 | 1 | 1 | 1 | 1 | 0 | 0 | 0 | 0 | 0 | 0 |
| | 11 | 0 | 1 | 1 | 1 | 1 | 1 | 1 | 1 | 1 | 0 | 0 | 0 | 0 | 0 | 0 |
| | 10 | 0 | 1 | 1 | 1 | 1 | 1 | 1 | 1 | 1 | 1 | 0 | 0 | 0 | 0 | 0 |
| | 9 | 0 | 1 | 1 | 1 | 1 | 1 | 1 | 1 | 1 | 1 | 0 | 0 | 0 | 0 | 0 |
| | 8 | 0 | 1 | 1 | 1 | 1 | 1 | 1 | 1 | 1 | 1 | 1 | 0 | 0 | 0 | 0 |
| | 7 | 0 | 1 | 1 | 1 | 1 | 1 | 1 | 1 | 1 | 1 | 1 | 1 | 0 | 0 | 0 |
| | 6 | 0 | 1 | 1 | 1 | 1 | 1 | 1 | 1 | 1 | 1 | 1 | 1 | 1 | 1 | 1 |
| | 5 | 0 | 0 | 0 | 0 | 0 | 0 | 0 | 0 | 0 | 0 | 0 | 0 | 0 | 0 | 0 |

FIG. 10(b)

| | | CRANK ANGLE | | | | | | | | | | | | | | |
|---|---|---|---|---|---|---|---|---|---|---|---|---|---|---|---|---|
| | | 6 | 12 | 18 | 24 | 30 | 36 | 42 | 48 | 54 | 60 | 66 | 72 | 78 | 84 | 90 |
| FREQUENCY | 25 | 0 | 1 | 0 | 0 | 0 | 0 | 0 | 0 | 0 | 0 | 0 | 0 | 0 | 0 | 0 |
| | 24 | 0 | 1 | 0 | 0 | 0 | 0 | 0 | 0 | 0 | 0 | 0 | 0 | 0 | 0 | 0 |
| | 23 | 0 | 1 | 1 | 0 | 0 | 0 | 0 | 0 | 0 | 0 | 0 | 0 | 0 | 0 | 0 |
| | 22 | 0 | 1 | 1 | 0 | 0 | 0 | 0 | 0 | 0 | 0 | 0 | 0 | 0 | 0 | 0 |
| | 21 | 0 | 1 | 1 | 1 | 0 | 0 | 0 | 0 | 0 | 0 | 0 | 0 | 0 | 0 | 0 |
| | 20 | 0 | 1 | 0 | 1 | 1 | 0 | 0 | 0 | 0 | 0 | 0 | 0 | 0 | 0 | 0 |
| | 19 | 0 | 1 | 0 | 0 | 1 | 1 | 0 | 0 | 0 | 0 | 0 | 0 | 0 | 0 | 0 |
| | 18 | 0 | 1 | 0 | 0 | 1 | 1 | 0 | 0 | 0 | 0 | 0 | 0 | 0 | 0 | 0 |
| | 17 | 0 | 1 | 1 | 1 | 0 | 1 | 1 | 0 | 0 | 0 | 0 | 0 | 0 | 0 | 0 |
| | 16 | 0 | 1 | 1 | 1 | 0 | 1 | 1 | 0 | 0 | 0 | 0 | 0 | 0 | 0 | 0 |
| | 15 | 0 | 1 | 0 | 0 | 1 | 1 | 0 | 0 | 0 | 0 | 0 | 0 | 0 | 0 | 0 |
| | 14 | 0 | 1 | 1 | 0 | 0 | 1 | 1 | 1 | 0 | 0 | 0 | 0 | 0 | 0 | 0 |
| | 13 | 0 | 1 | 1 | 0 | 0 | 1 | 1 | 0 | 0 | 0 | 0 | 0 | 0 | 0 | 0 |
| | 12 | 0 | 1 | 1 | 1 | 0 | 0 | 0 | 1 | 1 | 0 | 0 | 0 | 0 | 0 | 0 |
| | 11 | 0 | 1 | 1 | 1 | 1 | 0 | 0 | 0 | 1 | 1 | 0 | 0 | 0 | 0 | 0 |
| | 10 | 0 | 1 | 0 | 0 | 1 | 1 | 1 | 0 | 0 | 1 | 1 | 0 | 0 | 0 | 0 |
| | 9 | 0 | 1 | 0 | 0 | 0 | 1 | 1 | 0 | 0 | 1 | 1 | 0 | 0 | 0 | 0 |
| | 8 | 0 | 1 | 0 | 0 | 0 | 1 | 1 | 1 | 0 | 1 | 1 | 1 | 0 | 0 | 0 |
| | 7 | 0 | 1 | 1 | 1 | 1 | 1 | 1 | 1 | 1 | 1 | 1 | 1 | 1 | 1 | 0 |
| | 6 | 0 | 1 | 1 | 1 | 1 | 1 | 1 | 1 | 1 | 1 | 1 | 1 | 1 | 1 | 1 |
| | 5 | 0 | 0 | 0 | 0 | 0 | 0 | 0 | 0 | 0 | 0 | 0 | 0 | 0 | 0 | 0 |

FIG. 11

| | | CRANK ANGLE | | | | | | | | | | | | | | |
|---|---|---|---|---|---|---|---|---|---|---|---|---|---|---|---|
| | | 6 | 12 | 18 | 24 | 30 | 36 | 42 | 48 | 54 | 60 | 66 | 72 | 78 | 84 | 90 |
| FREQUENCY | 25 | 1 | 1 | 1 | 1 | 1 | 1 | 1 | 1 | 1 | 1 | 1 | 1 | 1 | 1 | 1 |
| | 24 | 1 | 1 | 1 | 1 | 1 | 1 | 1 | 1 | 1 | 1 | 1 | 1 | 1 | 1 | 1 |
| | 23 | 1 | 1 | 1 | 1 | 1 | 1 | 1 | 1 | 1 | 1 | 1 | 1 | 1 | 1 | 1 |
| | 22 | 1 | 1 | 1 | 1 | 1 | 1 | 1 | 1 | 1 | 1 | 1 | 1 | 1 | 1 | 1 |
| | 21 | 1 | 1 | 1 | 1 | 1 | 1 | 1 | 1 | 1 | 1 | 1 | 1 | 1 | 1 | 1 |
| | 20 | 1 | 5 | 5 | 5 | 5 | 1 | 1 | 1 | 1 | 1 | 1 | 1 | 1 | 1 | 1 |
| | 19 | 1 | 1 | 1 | 1 | 1 | 1 | 1 | 1 | 1 | 1 | 1 | 1 | 1 | 1 | 1 |
| | 18 | 1 | 1 | 1 | 1 | 1 | 1 | 1 | 1 | 1 | 1 | 1 | 1 | 1 | 1 | 1 |
| | 17 | 1 | 1 | 1 | 1 | 1 | 1 | 1 | 1 | 1 | 1 | 1 | 1 | 1 | 1 | 1 |
| | 16 | 1 | 1 | 1 | 1 | 1 | 1 | 1 | 1 | 1 | 1 | 1 | 1 | 1 | 1 | 1 |
| | 15 | 1 | 5 | 5 | 5 | 5 | 1 | 1 | 1 | 1 | 1 | 1 | 1 | 1 | 1 | 1 |
| | 14 | 1 | 1 | 1 | 1 | 1 | 1 | 1 | 1 | 1 | 1 | 1 | 1 | 1 | 1 | 1 |
| | 13 | 1 | 5 | 5 | 5 | 5 | 1 | 1 | 1 | 1 | 1 | 1 | 1 | 1 | 1 | 1 |
| | 12 | 1 | 1 | 1 | 1 | 1 | 1 | 1 | 1 | 1 | 1 | 1 | 1 | 1 | 1 | 1 |
| | 11 | 1 | 5 | 5 | 5 | 5 | 1 | 1 | 1 | 1 | 1 | 1 | 1 | 1 | 1 | 1 |
| | 10 | 1 | 1 | 1 | 1 | 1 | 5 | 5 | 5 | 5 | 5 | 5 | 1 | 1 | 1 | 1 |
| | 9 | 1 | 1 | 1 | 1 | 1 | 1 | 1 | 1 | 1 | 1 | 1 | 1 | 1 | 1 | 1 |
| | 8 | 1 | 1 | 1 | 1 | 1 | 1 | 1 | 1 | 1 | 1 | 1 | 1 | 1 | 1 | 1 |
| | 7 | 1 | 1 | 1 | 1 | 1 | 1 | 1 | 1 | 1 | 1 | 1 | 1 | 1 | 1 | 1 |
| | 6 | 1 | 5 | 5 | 5 | 5 | 5 | 5 | 5 | 5 | 5 | 5 | 5 | 1 | 1 | 1 |
| | 5 | 1 | 1 | 1 | 1 | 1 | 1 | 1 | 1 | 1 | 1 | 1 | 1 | 1 | 1 | 1 |

|  |  | NE[rpm] | | | | | | |
|---|---|---|---|---|---|---|---|---|
|  |  | 1000 | 2000 | 3000 | 4000 | 5000 | 6000 | 7000 |
| PBA [kPa] | 107 | 0.8 | 0.8 | 0.9 | 0.9 | 0.95 | 0.95 | 0.95 |
|  | 93 | 0.8 | 0.8 | 0.9 | 0.9 | 0.9 | 0.9 | 0.9 |
|  | 80 | 0.7 | 0.8 | 0.95 | 0.8 | 0.7 | 0.8 | 0.8 |
|  | 67 | 0.8 | 0.9 | 0.8 | 0.95 | 0.95 | 0.95 | 0.95 |
|  | 53 | 0.95 | 0.95 | 0.8 | 0.95 | 0.95 | 0.95 | 0.95 |

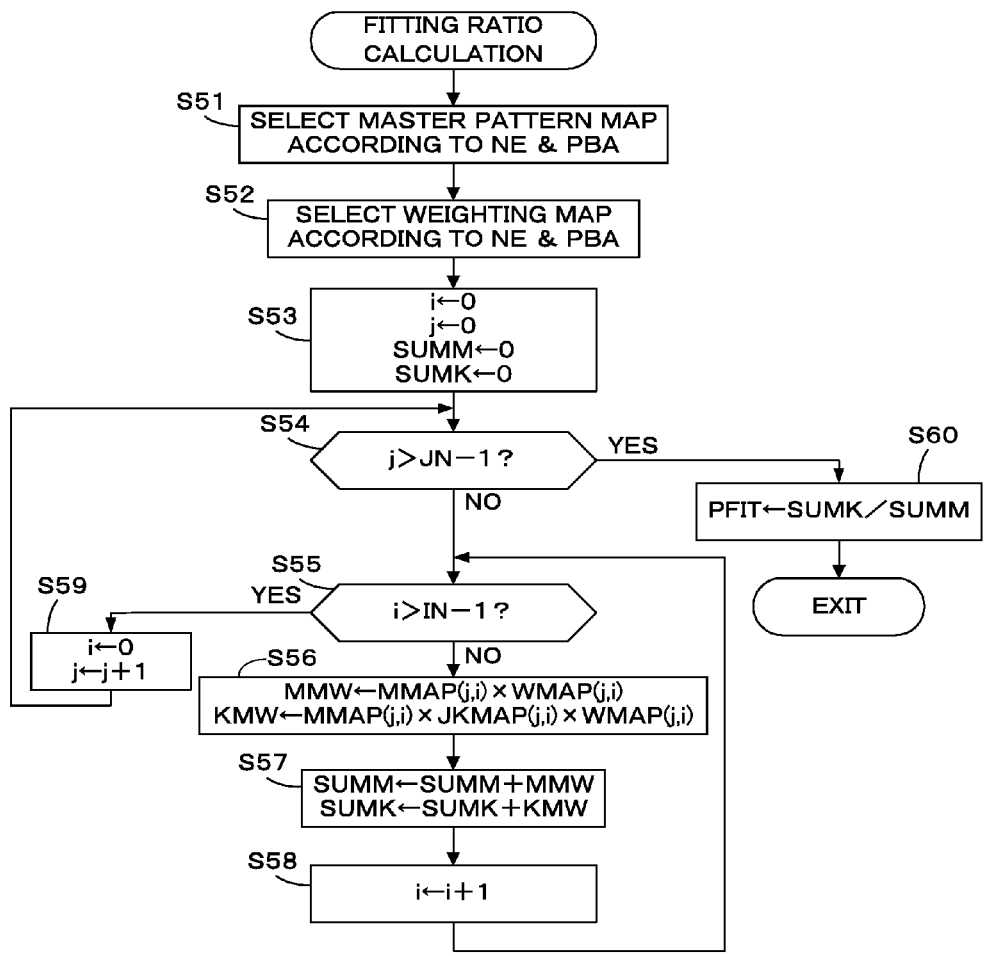

FIG. 19

|  |  | NE | | | | | |
|---|---|---|---|---|---|---|---|
|  |  | LOW ENGINE SPEED REGION | | MEDIUM ENGINE SPEED REGION | | HIGH ENGINE SPEED REGION | |
| PBA | LOW ENGINE LOAD REGION | MASTER PATTERN MAP | WEIGHTING MAP | MASTER PATTERN MAP | WEIGHTING MAP | MASTER PATTERN MAP | WEIGHTING MAP |
|  | MEDIUM ENGINE LOAD REGION | MASTER PATTERN MAP | WEIGHTING MAP | MASTER PATTERN MAP | WEIGHTING MAP | MASTER PATTERN MAP | WEIGHTING MAP |
|  | HIGH ENGINE LOAD REGION | MASTER PATTERN MAP | WEIGHTING MAP | MASTER PATTERN MAP | WEIGHTING MAP | MASTER PATTERN MAP | WEIGHTING MAP |

FREQUENCY SPECTRUM ANALYZING APPARATUS

TECHNICAL FIELD

The present invention relates to a frequency spectrum analyzing apparatus which performs a frequency spectrum analysis with respect to a detected value of an operating parameter of an internal combustion engine in synchronism with rotation of the engine.

BACKGROUND ART

Patent Document 1 (shown below) shows a signal processing apparatus which performs a frequency spectrum analysis of a signal output from a knock sensor mounted on an internal combustion engine, using the discrete Fourier transform algorithm (hereinafter referred to as "DFT algorithm") and the fast Fourier transform algorithm (hereinafter referred to as "FFT algorithm"). The intensity of a necessary frequency component (which is specifically a central frequency component of the knock sensor output) may not be obtained by the FFT algorithm since a special algorithm is employed in the FFT algorithm for improving a calculation speed. Therefore, in the above signal processing apparatus, the central frequency component of the knock sensor is calculated using the DFT algorithm, and frequency components other than the central frequency component are calculated using the FFT algorithm.

PRIOR ART DOCUMENT

Patent Document

Patent Document 1: Japanese Patent Laid-open No. H11-303673.

SUMMARY OF THE INVENTION

Problems to be Solved by the Invention

It is basically necessary to perform the frequency spectrum analysis of the knock sensor output signal in synchronism with rotation of the engine. Accordingly, it is required to further shorten the calculation time period of the frequency spectrum analysis when the engine rotational speed is high.

However, this point is not taken into consideration in the apparatus shown in the patent document 1. Consequently, the time period which can be secured for determining occurrence of the knocking using frequency component intensities obtained by the frequency spectrum analysis, may become shorter, and the determination may not be performed accurately.

The present invention is made contemplating the above described point, and an object of the present invention is to provide a frequency spectrum analyzing apparatus which can appropriately perform the frequency component intensity calculation when performing the frequency spectrum analysis of a detected parameter in synchronism with rotation of the internal combustion engine, to improve the calculation speed especially when the engine rotational speed is high.

Means for Solving the Problem

To attain the above object, the present invention provides a frequency spectrum analyzing apparatus for performing a frequency spectrum analysis with respect to a detected value (VKNK) of an operating parameter of an internal combustion engine in synchronism with rotation of the engine. The frequency spectrum analyzing apparatus includes sampling means, element intensity calculating means, and frequency component intensity calculating means. The sampling means samples the operating parameter at predetermined time intervals (TSMP), and converts a sampled value to a digital value. The element intensity calculating means calculates intensities of first and second elements (DMFTS, DMFTC) with respect to a predetermined number (ND) of the sampled values. The first elements and second elements (DMFTS, DMFTC) respectively correspond to a plurality of frequency components contained in the detected value (VKNK), and a phase of the second element differs from a phase of the first element by 90 degrees. The frequency component intensity calculating means calculates frequency component intensities (STFT) corresponding to the plurality of the frequencies in synchronism with rotation of the engine, using the first element intensities (DMFTS) and the second element intensities (DMFTC). The frequency component intensity calculating means calculates the frequency component intensities (STFT) by replacing a part of an integrated value of the first element intensities, and a part of an integrated value of the second element intensities respectively with corresponding preceding calculated values (TRMS1, TRMC1), when an rotational speed (NE) of the engine is higher than or equal to a set threshold value (NETH).

With this configuration, the operating parameter is sampled at predetermined time intervals, and the sampled value is converted to a digital value. Intensities of first and second elements, which respectively correspond to a plurality of frequency components contained in the detected value, are calculated with respect to the predetermined number of the sampled values, wherein the phase of the second element differs from the phase of the first element by 90 degrees. The frequency component intensities are calculated by replacing a part of the integrated value of the first element intensities, and a part of the integrated value of the second element intensities respectively with corresponding preceding calculated values, when the rotational speed of the engine is higher than or equal to the set threshold value. Therefore, when calculating the frequency component intensities, it is not necessary to repeatedly perform the part of integrating calculation of the first and second element intensities, which makes it possible to improve the calculation speed. Consequently, the time period for the post process using the calculated frequency component intensities can be secured sufficiently.

Preferably, the set threshold value (NETH) is set according to a time period (TS) which is necessary for obtaining the predetermined number (ND) of the sampled values.

With this configuration, the set threshold value of the engine rotational speed is set according to a time period necessary for obtaining the predetermined number of the sampled values. Specifically, when the engine rotational speed becomes higher and the calculation period of the frequency component intensities becomes shorter than the time period necessary for obtaining the predetermined number of the sampled values, the preceding calculated values and the present calculated values of the first and second element intensities partly overlap. Therefore, the preceding calculated values can be used for the overlapped part of the intensities.

Preferably, the set threshold value (NNETH) is set according to a number (NS) of steps per unit time which are necessary for calculating the frequency component intensities (STFT).

With this configuration, the set threshold value of the engine rotational speed is set according to the number of steps per unit time necessary for calculating the frequency component intensities. As described above, the preceding calculated values can be used for the overlapped part of the intensities, since the preceding calculated values and the present calculated values of the first and second element intensities partly overlap when the engine rotational speed becomes higher and the calculation period of the frequency component intensities becomes shorter than the time period necessary for obtaining the predetermined number of the sampled values. However, as for the actual calculation device, the processing of applying the preceding calculated values of the element intensities to the calculation of the frequency component intensities makes the number of processing steps increase, and the calculation speed may sometimes decrease. By setting the set threshold value to the engine rotational speed at which the number of steps per unit time necessary for calculating the frequency component intensities reaches the saturation point, the intensity calculation can be performed accurately according to the performance (characteristic) of the calculation device.

Preferably, the frequency component intensity calculating means calculates the frequency component intensities (STFT) using sampled values which are obtained in a predetermined time period, wherein the center of the predetermined time period is a timing at which a trigger signal (CRK interrupt) is generated in synchronism with rotation of the engine.

With this configuration, the frequency component intensities are calculated using the sampled values obtained in the predetermined time period whose center is a timing at which the trigger signal is generated in synchronism with rotation of the engine. Accordingly, the frequency spectrum analysis with respect to a range whose center is the object rotation angle of the engine, can be performed. Therefore, the frequency spectrum analysis is less influenced by changes in the engine rotation, compared with the method using the digital values sampled in a predetermined time period which starts from a timing at which the trigger signal is generated, or in a predetermined time period which ends at a timing at which the trigger signal is generated.

BRIEF DESCRIPTION OF THE DRAWINGS

FIGS. 3(a)-3(d) show time charts for illustrating a method for calculating a frequency component intensity (STFT) and a timing relationship in the method.

FIGS. 4(a) and 4(b) show time charts for illustrating a relationship between a calculation period (TS) of the frequency component intensity and a generation period (CRME) of a CRK interrupt.

FIGS. 7(a) and 7(b) show diagrams of the intensity data obtained by the frequency spectrum analysis as a time series spectrum map and a binarized time series spectrum map.

FIG. 8 is a diagram showing the binarized time series spectrum map of the seating noise of the intake valve.

FIGS. 9(a) and 9(b) show diagrams of binarized time series spectrum maps for illustrating a noise removal process.

FIGS. 10(a) and 10(b) show diagrams of binarized time series spectrum maps for illustrating the knocking determination using a master pattern map.

FIG. 11 is a diagram showing an example of the weighting map.

FIG. 18 is a flowchart of the fitting ratio calculation process executed in the process shown in FIG. 12.

FIG. 19 is a diagram for illustrating the map referred to in the process of FIG. 18.

MODE FOR CARRYING OUT THE INVENTION

Preferred embodiments of the present invention will now be described with reference to the drawings.

Figure 1:
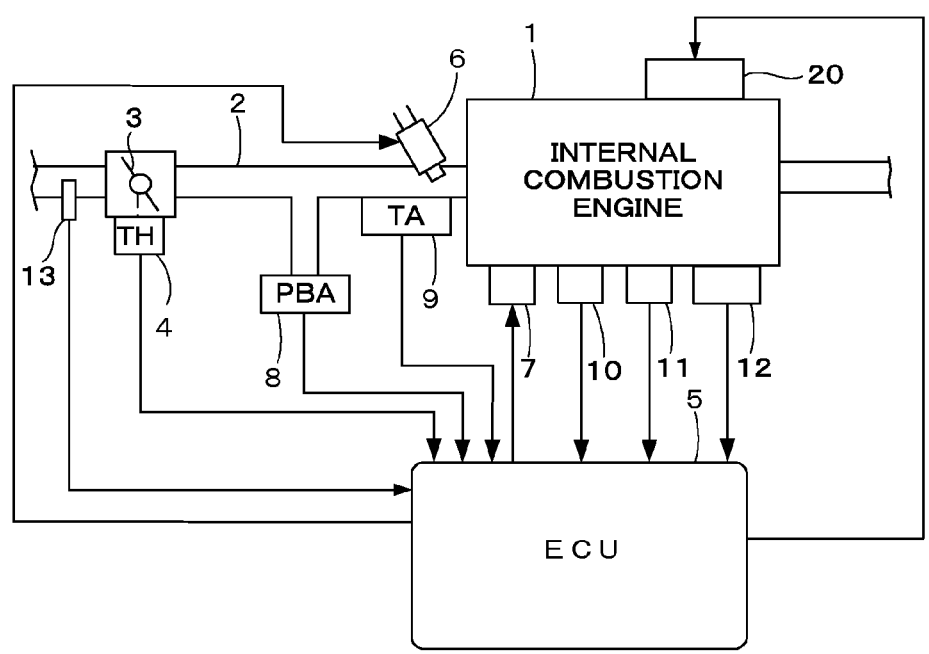
FIG. 1 is a schematic diagram showing a configuration of an internal combustion engine and a control system therefor according to one embodiment of the present invention.

FIG. 1 is a schematic diagram showing a general configuration of an internal combustion engine (hereinafter referred to as "engine") and a control system therefor according to one embodiment of the present invention. The engine 1 is, for example, a four-cylinder engine having an intake pipe 2 provided with a throttle valve 3. A throttle valve opening sensor 4 which detects a throttle valve opening TH is connected to the throttle valve 3, and a detection signal of the sensor 4 is supplied to an electronic control unit (hereinafter referred to as "ECU") 5.

A fuel injection valve 6 is provided for each cylinder at a position slightly upstream of an intake valve (not shown) in the intake pipe 2 and between the engine 1 and the throttle valves 3. Each injection valve is connected to a fuel pump (not shown) and electrically connected to the ECU 5. A valve opening period of the fuel injection valve 6 is controlled by a signal from the ECU 5. Each cylinder of the engine 1 is provided with a spark plug 7 and each spark plug 7 is connected to the ECU 5. The ECU 5 supplies an ignition signal to each spark plug 7.

An intake pressure sensor 8 for detecting an intake pressure PBA and an intake air temperature sensor 9 for detecting an intake air temperature TA are disposed downstream of the throttle valve 3. Further, a coolant temperature sensor 10 for detecting an engine coolant temperature TW and a knock sensor 11 of the nonresonant type are mounted on the body of the engine 1. The detection signals from the sensors 8 to 11 are supplied to the ECU 5. For example, a sensor which can detect vibration of the frequency band from 5 kHz to 25 kHz is used as the knock sensor 11.

An intake air flow rate sensor 13 for detecting an intake air flow rate GA is provided upstream of the throttle valve 3 in the intake pipe 2, and a detection signal of the intake air flow rate sensor 13 is supplied to the ECU 5.

A crank angle position sensor 12 for detecting a rotational angle of a crankshaft (not shown) of the engine 1 is connected to the ECU 5, and a signal corresponding to a detected rotation angle of the crankshaft is supplied to the ECU 5. The crank angle position sensor 12 includes a cylinder discrimination sensor which outputs a pulse (hereinafter referred to as "CYL pulse") at a predetermined crank angle position for the specific cylinder of the engine 1. The crank angle position sensor 12 also includes a top dead center (TDC) sensor which outputs a TDC pulse at a crank angle position before a TDC of a predetermined crank angle starts at an intake stroke in each cylinder (i.e., at every 180 degree crank angle in the case of four-cylinder engine) and a crank angle (CRK) sensor for generating one pulse (hereinafter referred to as "CRK pulse") in a constant crank angle period (e.g., a period of 6 degrees, which is shorter than the period of generation of the TDC pulse). The CYL pulse, the TDC pulse and the CRK pulse are supplied to the ECU 5. The CYL, TDC and CRK pulses are used for controlling various timings, such as a fuel injection timing and an ignition timing, and detecting an engine rotational speed NE.

The engine 1 is provided with a valve operating characteristic varying device 20 having a first valve operating characteristic varying mechanism and a second valve operating characteristic varying mechanism. The first valve operating characteristic varying mechanism continuously varies the valve lift amount and opening angle (valve opening period) of the intake valve (not shown). The second valve operating characteristic varying mechanism is a cam phase varying mechanism for continuously varying the operating phase of the cam for driving the intake valves with reference to a rotational angle of the crank shaft of the engine 1. The ECU 5 supplies a lift-amount control signal and an operating-phase control signal to a valve operating characteristic varying device 20, and performs the operation control of the intake valve. The configurations of the first and second valve operating characteristic varying mechanisms are respectively shown, for example, in Japanese Patent Laid open No. 2008-25418, and the Japanese Patent Laid open No. 2000-227013.

The ECU 5 includes an input circuit having various functions including a function of shaping the waveforms of input signals from the various sensors, a function of correcting the voltage levels of the input signals to a predetermined level, and a function of converting analog signal values into digital signal values. The ECU 5 further includes a central processing unit (hereinafter referred to as "CPU"), a memory circuit (memory), and a output circuit. The memory circuit preliminarily stores various operating programs to be executed by the CPU and the results of computation or the like by the CPU. The output circuit supplies drive signals to the fuel injection valves 6 and the spark plugs 7.

Figure 2A:
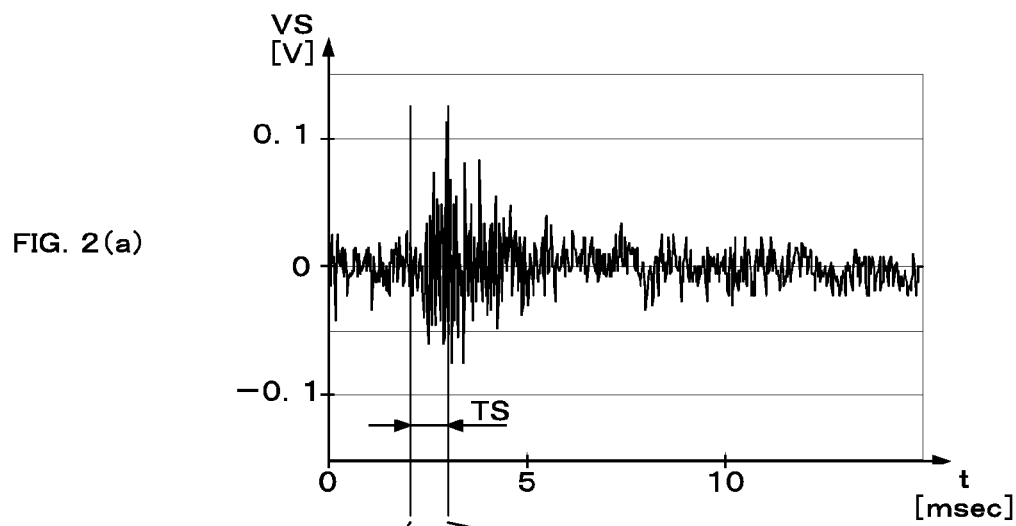
FIGS. 2(a)-2(c) show diagrams for illustrating the sampling and the frequency spectrum analysis of a knock sensor output.
Figure 2B:
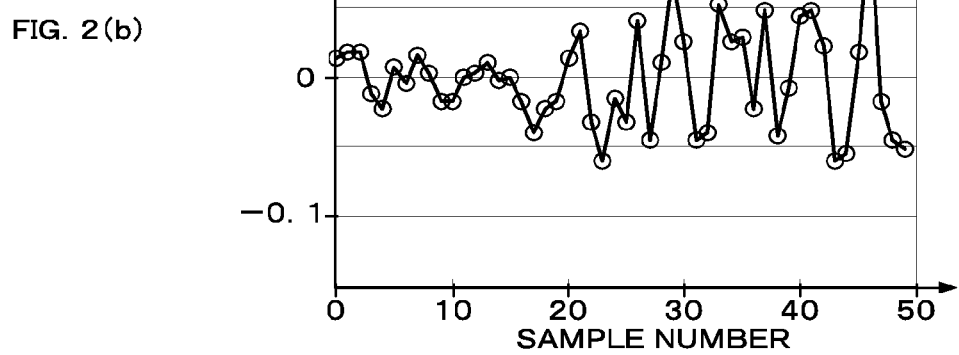
Figure 2C:
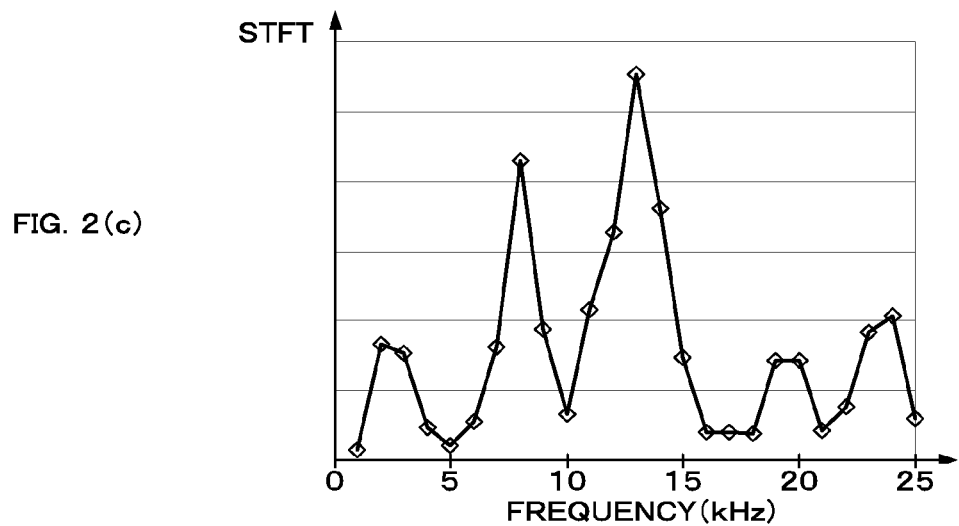

In this embodiment, a frequency spectrum analysis is performed with respect to the output signal of the knock sensor 11, and the knocking determination is performed based on the frequency component intensities obtained as a result of the frequency spectrum analysis. Therefore, an outline of the frequency spectrum analysis in this embodiment is described below. FIGS. 2(a)-2(c) show diagrams for illustrating the sampling and the frequency spectrum analysis performed with respect to the output signal of the knock sensor. FIG. 2(a) shows an output signal waveform of the knock sensor 11, and FIG. 2(b) shows an enlarged waveform of the period TS in FIG. 2(a). In this embodiment, the frequency spectrum analysis by the discrete Fourier transform (DFT) is performed with respect to 50 data detected at sampling periods of 20 microseconds. A result of the frequency spectrum analysis is shown in FIG. 2(c). The vertical axis of FIG. 2(c) represents a frequency component intensity STFT. In this embodiment, values of the frequency component intensity STFT corresponding to frequencies with 1 kHz interval in the frequency band from 5 kHz to 25 kHz (i.e., 5, 6, 7, . . . , 24, and 25 kHz) are calculated at every six degrees of the crank angle (at the timing when the crankshaft of the engine 1 rotates every six degrees).

FIGS. 3(a)-3(d) show time charts for illustrating the above-described frequency spectrum analysis. FIG. 3(a) shows address numbers corresponding to addresses of the memory which sequentially stores "50" detected values VKNK (digital values) obtained by sampling the output signal of the knock sensor 11 at intervals of 20 microseconds. FIG. 3(b) shows a memory stored state of sine-wave component intensities DMFTS and cosine-wave component intensities DMFTC which are calculated using the detected data VKNK. The address numbers shown in FIG. 3(b) are the same as those in FIG. 3(a). The sine-wave component intensities DMFTS and cosine-wave component intensities DMFTC are calculated at every 1 millisecond corresponding to 21 frequencies from 5 kHz to 25 kHz corresponding to one sampled value of the detected data VKNK.

FIG. 3(c) shows the CRK pulse signal output from the crank angle position sensor 12. In this embodiment, the fall timing of the CRK pulse is used as a reference of the calculation execution timing (hereinafter referred to as "CRK interrupt"). In this embodiment, the timing when the CRK interrupt occurs is stored in the memory and a frequency component intensity STFT(j,i) of each frequency (5-25 kHz) is calculated using the sine-wave component intensities DMFTS and the cosine-wave component intensities DMFTC corresponding to 50 detected data obtained in the sampling period TS whose center is the stored timing of the CRK interrupt. That is, the sampling period TS is set so that the center of the sampling period TS is equal to the CRK interrupt timing. The parameter "j" is an index parameter indicative of the frequency (hereinafter referred to as "frequency index"), and values of 0, 1, 2, . . . , 20 of the frequency index j correspond to frequencies of 5, 6, 7, . . . , 25 kHz. The parameter "i" is an index parameter indicative of the crank angle CA at which the CRK interrupt occurs (hereinafter referred to as "crank angle index"), and values of 0, 1, 2, . . . , 14 of the crank angle index i correspond to crank angles of 6, 12, 18, . . . , 90 degrees.

In the example shown in FIG. 3(d) an index parameter m (=1 to 50) indicates the data applied to calculating the frequency component intensity STFT(j,i). At the first CRK interrupt timing, the frequency component intensity STFT(j,i) is calculated using the 50 data whose center is a detected value of the address number "5" (the detected value corresponding to the value "25" of the index parameter m). At the next CRK interrupt timing, the frequency component intensity STFT(j, i+1) is calculated using the 50 data whose center is a detected value of the address number "45" (the detected value corresponding to the value "25" of the index parameter m). It is to be noted that the frequency component intensity STFT(j,i) is a non-dimensional quantity indicative of a relative intensity.

By applying the 50 data whose center is the detected value corresponding to the value "25" of the index parameter m, i.e., the 50 data obtained in the sampling period whose center is the CRK interrupt timing, to calculating the frequency component intensity STFT(j,i), the frequency spectrum analysis can be performed with respect to a range whose center is the object rotation angle of the engine. Therefore, the frequency spectrum analysis is less influenced by changes in the engine rotation, compared with the method using the detected values sampled in the sampling period which starts from the timing the CRK interrupt occurs, or in the sampling period which ends at the timing the CRK interrupt occurs.

FIGS. 4(a) and 4(b) show a relationship between an occurrence period CRME of the CRK interrupt and the sampling period TS (which is indicated as "STFT CAL.") in which the detected data applied to calculation of the frequency component intensity STFT are sampled. FIG. 4(a) shows an example wherein the engine rotational speed NE is 1000 rpm and the sampling period TS is equal to the interrupt occurrence period CRME. Accordingly, when the engine rotational speed NE exceeds 1000 rpm, the sampling period TS partly overlaps each other. FIG. 4(b) shows another example wherein the engine rotational speed NE is a little higher than 2000 rpm and the overlapped portion of the sampling period TS becomes longer.

In this embodiment, if the sampling period TS overlaps as described above, the preceding calculated values are used as an integrated value of the sine-wave component intensity DMFTS and an integrated value of the cosine-wave component intensity DMFTC with respect to the overlapped portion, thereby shortening the calculation time period for calculating the frequency component intensity STFT.

Figure 5:
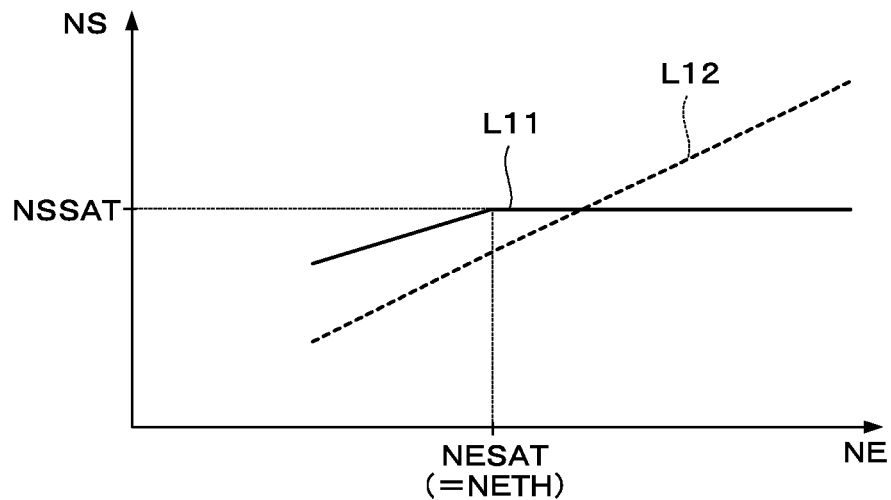
FIG. 5 is a diagram showing a relationship between an engine rotational speed (NE) and a number of calculation steps per unit time.

However, the calculation using the preceding calculated values makes the number of processing steps per unit time increase depending on the characteristic of the computing device, when the ratio of the number of overlapped data applicable to the present calculation is small. The solid line L11 shown in FIG. 5 shows a relationship between the number NS of processing steps per unit time of the CPU used in this embodiment and the engine rotational speed NE, when the frequency component intensity calculation is performed using the preceding calculated values. The processing step number NS increases until the engine rotational speed NE reaches the rotational speed NESAT (hereinafter referred to as "step number saturation rotational speed NESAT"), and takes a constant value NSSAT in the range where the engine rotational speed NE is equal to or higher than the step number saturation rotational speed NESAT. Therefore, in this embodiment, a threshold value NETH is set to the step number saturation rotational speed NESAT, and the calculation using the preceding calculated values is performed when the engine rotational speed NE is equal to or higher than the threshold value NETH.

The dashed line L12 shown in FIG. 5 shows a relationship between the processing step number NS and the engine rotational speed NE, when using the FFT (fast Fourier transform) algorithm. As shown in FIG. 5, the processing step number NS linearly increases as the engine rotational speed increases when using the FFT algorithm. In contrast, the increase in the processing step number NS can be suppressed when using the DFT algorithm and employing the method of using the preceding calculated values in the range where the engine rotational speed is high (NE>NETH).

Figure 6:
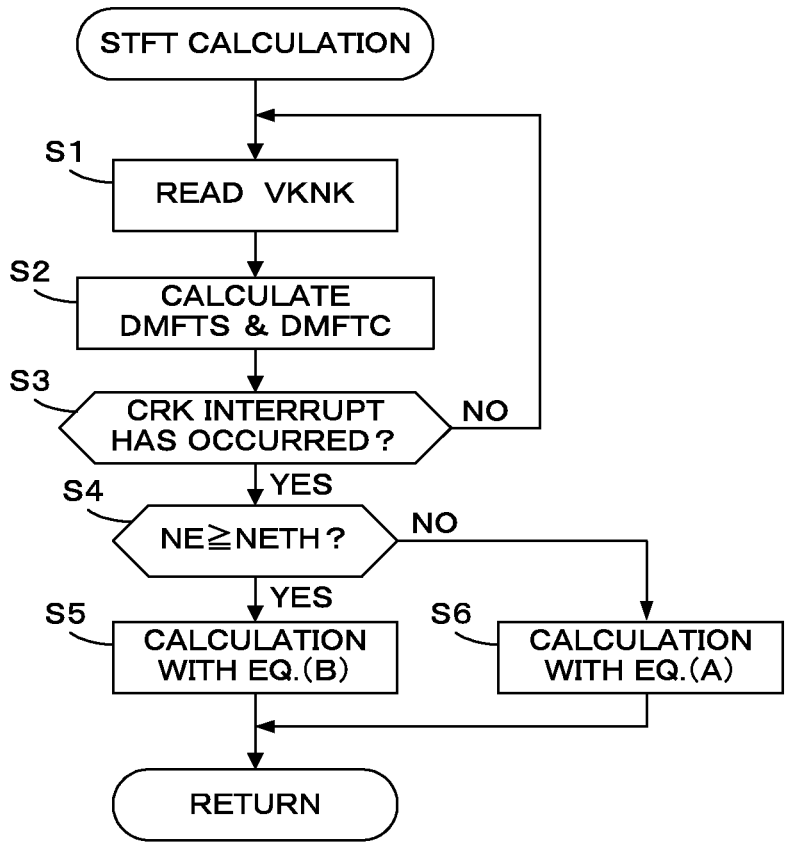
FIG. 6 is a flowchart for illustrating the method for calculating the frequency component intensity (STFT).

FIG. 6 shows a flowchart of a method for calculating the frequency component intensity STFT. In step S1, the detected value VKNK is read. In step S2, the sine-wave component intensity DMFTS(j,k) and the cosine-wave component intensity DMFTC(j,k) are calculated with the following equations (1) and (2). The index parameter k is an address number shown in FIG. 3(b), and takes values from "1" to ND ("50" in this embodiment). "Δt" is equal to a value of (sampling period×ND), and set to 1 millisecond in this embodiment.

$$DMFTS(j,k) = VKNK(k) \times \sin\{2\pi \times (j+5) \times 1000 \times \Delta t \times k / ND\} \quad (1)$$

$$DMFTC(j,k) = VKNK(k) \times \cos\{2\pi \times (j+5) \times 1000 \times \Delta t \times k / ND\} \quad (2)$$

The process of steps S1 and S2 are executed at every sampling periods (20 microseconds).

In step S3, it is determined whether or not the CRK interrupt has occurred. If the CRK interrupt has not occurred, the process returns to step S1. At the timing the CRK interrupt has occurred, it is determined whether or not the engine rotational speed NE is equal to or higher than the threshold value NETH in step S4. If NE is lower than NETH, the frequency component intensity STFT(j,i) is calculated with the following first equation (A) in which the preceding used data are not used in step S6. If NE is equal to or higher than NETH, the frequency component intensity STFT(j,i) is calculated with the following second equation (B) in which the preceding used data are used in step S5. The index parameter m is a modified address number which is set so that the address number k upon occurrence of the CRK interrupt is equal to "25" (refer to FIG. 3(d)). The index parameter mp is a modified address number which is applied in the preceding calculation. The parameter mx is a preceding boundary index given by the following equation (3), and the parameter my is a present boundary index given by the following equation (4).

[Eq. 1]

$$STFT(j, i) = \sqrt{\left(\sum_{m=1}^{ND} DMFTS(j, m)\right)^2 + \left(\sum_{m=1}^{ND} DMFTC(j, m)\right)^2} \quad (A)$$

$$STFT(j, i) = \sqrt{\left(\underbrace{\sum_{mp=mx}^{ND} DMFTS(j, mp)}_{TRMS1} + \underbrace{\sum_{m=my}^{ND} DMFTS(j, m)}_{TRMS2}\right)^2 + \left(\underbrace{\sum_{mp=mx}^{ND} DMFTC(j, mp)}_{TRMC1} + \underbrace{\sum_{m=my}^{ND} DMFTC(j, m)}_{TRMC2}\right)^2} \quad (B)$$

$$mx = ND - NV + 1 \quad (3)$$

$$my = NV + 1 \quad (4)$$

where NV is a number of data which are used in the preceding calculation of STFT and are applicable to the present calculation of STFT, and the data number NV increases as the engine rotational speed NE increases.

The first term TRMS1 and third term TRMC1 in the second equation (B) correspond to the preceding calculated values of the integrated values, and the second term TRMS2 and fourth term TRMC2 in the second equation (B) correspond to the integrated values which are newly calculated in the present calculation.

By replacing a part of the integrated value of the sine-wave component intensity and a part of the integrated value of the cosine-wave component intensity respectively with the preceding calculated values (TRMS1, TRMC1), to calculate the frequency component intensity STFT(j,i), it is not necessary to perform the part of integrating calculations of the sine-wave component intensity DMFTS and the cosine-wave component intensity DMFTC, which makes it possible to improve the calculation speed. Consequently, the time period for the post process using the calculated frequency component intensities can be secured sufficiently.

Next, an outline of the knocking determination method using the frequency component intensity STFT is described below with reference to FIGS. 7(a), 7(b), 8, 9(a), 9(b), 10(a), 10(b) and 11.

As described above, the frequency component intensity STFT is calculated as time series data in the form of a two-dimensional matrix as shown in FIG. 7(a) (hereinafter referred to as "time series spectrum map"). The time series spectrum map is defined by the vertical line of the frequency f [kHz] and the horizontal line of the crank angle CA [deg] (which is a crank angle from the top dead center at which the combustion stroke starts). In the time series spectrum map, indexes corresponding to the vertical and horizontal lines are respectively the frequency index j (j=0 to 20) and the crank angle index i (i=0 to 14), and an element of the time series spectrum map is expressed as an intensity parameter KMAP (j,i). The intensity parameter KMAP is the same parameter as the frequency component intensity STFT(j,i) in this embodiment, and the label "KMAP" is used since the intensity parameter KMAP is a parameter on the time series spectrum map. For example, the intensity parameter KMAP(0,0) corresponds to "34" at the lower left end. The intensity parameters KMAP(0,14), KMAP(20,0), and KMAP(20,14) respectively correspond to "31" at the lower right end, "56" at the upper left end, and "30" at the upper right end.

The time series spectrum map of FIG. 7(a) is binarized to obtain a binarized time series spectrum map shown in FIG. 7(b). A binarized intensity parameter NKMAP(j,i), which is an element of the map of FIG. 7(b), takes a value of "1" when the intensity parameter KMAP(j,i) is equal to or greater than "50", and takes a value of "0" when the intensity parameter KMAP(j,i) is less than "50".

Figure 22:
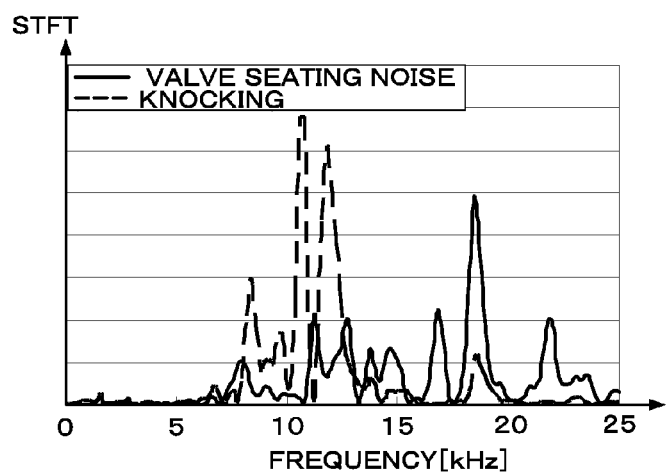
FIG. 22 shows frequency component intensities of the vibration detected by the knock sensor.

The binarized time series spectrum map shown in FIG. 7(b) is a map obtained when a knocking has occurred as shown in FIG. 22 with the dashed line. On the other hand, the binarized time series spectrum map of the seating noise (the noise due to seating of the intake valve of the engine on the fully-closed position) shown in FIG. 22 with the solid line is shown in FIG. 8. The map of FIG. 8 is clearly different from the map of FIG. 7(b) obtained when a knocking has occurred. Therefore, the seating noise is not erroneously determined to be occurrence of knocking, thereby performing the knocking determination accurately.

Further in this embodiment, a binarized time series spectrum map corresponding to noise components (this spectrum map will be hereinafter referred to as merely "noise map") is generated by the learning calculation based on the binarized time series spectrum map which is obtained when it is determined that no knocking has occurred. Subsequently, the noise learned values on the noise map are subtracted from the corresponding values on the binarized time series spectrum map calculated from the detected data, to remove the influence of noise components.

FIGS. 9(a) and 9(b) show diagrams of binarized time series spectrum maps corresponding to the removal of the influence of noise components. FIG. 9(a) shows an example of the noise map obtained by the learning calculation. In this example, noise components in the band of 6 to 25 kHz at the timing of six degrees of the crank angle are indicated. FIG. 9(b) shows a binarized time series spectrum map obtained by performing a noise removal process in which the noise components shown in FIG. 9(a) are subtracted from the values of the binarized time series spectrum map shown in FIG. 7(b). By performing the noise removal process described above, influence of the noise components is removed, which makes it possible to perform the determination more accurately.

Further in this embodiment FIGS. 10(a) and 10(b) show diagrams of binarized time series spectrum maps corresponding to the knocking determination using a master pattern map. For example, as shown in FIG. 10(a), whether a knocking has occurred is determined by comparing the binarized time series spectrum map obtained from the detected data with a master pattern map. The master pattern map corresponds to a typical binarized time series spectrum map obtained when a knocking has occurred.

The above-described comparison is specifically performed as described below. An intensity integrated value SUMK is calculated by integrating a product obtained by multiplying the binarized intensity parameter NKMAP(j,i) on the binarized time series spectrum map by the master parameter MMAP(j,i) on the master pattern map. A reference integrated value SUMM which is an integrated value of the master parameter MMAP(j,i) is calculated, and a fitting ratio PFIT (=SUMK/SUMM) is calculated as a ratio of the intensity integrated value SUMK with respect to the reference integrated value SUMM. Subsequently, if the fitting ratio PFIT exceeds a determination threshold value SLVL, it is determined that a knocking has occurred.

FIG. 10(b) shows a map of products (NKMAP(j,i)× MMAP (j,i)) obtained by multiplying the binarized intensity parameter NKMAP(j,i) shown in FIG. 9(b) by the master parameter MMAP(j,i) on the master pattern map shown in FIG. 10(a). In this example, the product map of FIG. 10(b) is completely the same as the map shown in FIG. 9(b), and the fitting ratio PFIT takes a value of "0.863".

It is to be noted that, in the actual knocking determination process described below, a weighting of the binarized intensity parameter is performed according to the engine operating condition when calculating the intensity integrated value SUMK and the reference integrated value SUMM. FIG. 11 shows an example of a weighting map in which weighting parameters WMAP(j,i) for performing the weighting are set. The weighting map shown in FIG. 11 is set so that the weighting of the following parameter values is performed: the parameter values from 12 to 72 degrees of the crank angle with respect to the frequency component of 6 kHz, the parameter values from 36 to 66 degrees of the crank angle with respect to the frequency component of 10 kHz, and the parameter values from 12 to 30 degrees of the crank angle with respect to the frequency components of 11 kHz, 13 kHz, 15 kHz, and 20 kHz.

The characteristic with respect to the frequency of the binarized time series spectrum map changes depending on the engine operating condition. Therefore, the weighting using the weighting map shown in FIG. 11 is performed for compensating such changes in the map characteristic. By performing the weighting according to the engine operating condition, it is possible to accurately perform the determination regardless of changes in the engine operating condition.

Figures 12, 13:
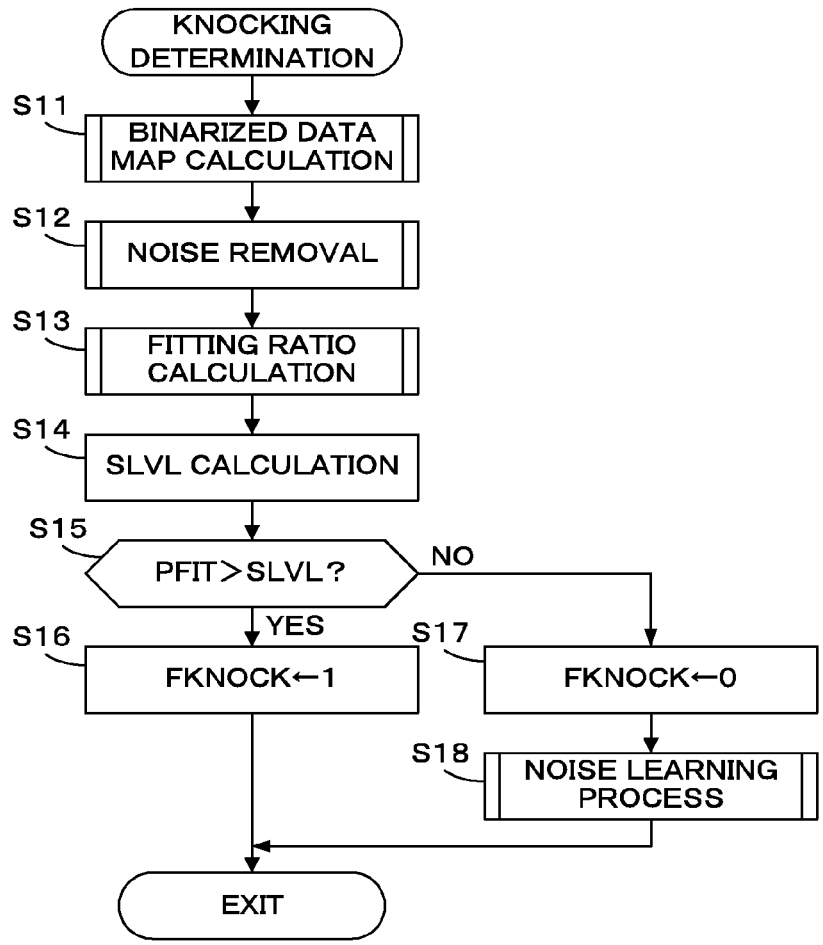
FIG. 12 is a flowchart of the knocking determination process.
FIG. 13 is a diagram showing a map referred to in the process of FIG. 12.

FIG. 12 is a flowchart of a process for performing the knocking determination with the above-described method. This process is executed by the CPU in the ECU 5 in synchronism with generation of the TDC pulse.

Figure 14:
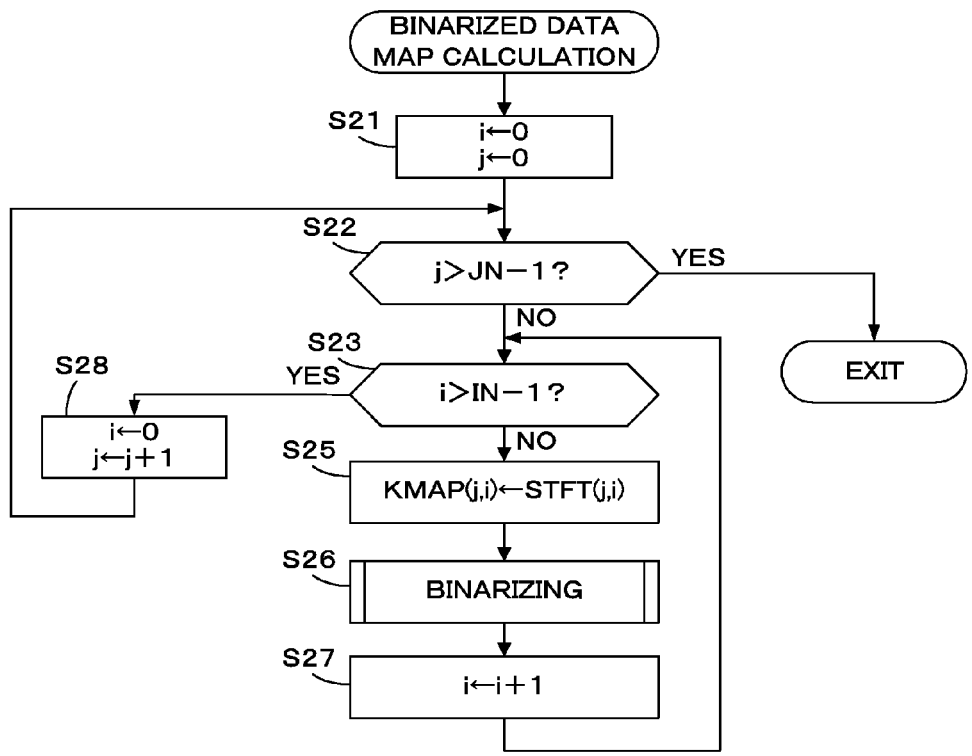
FIG. 14 is a flowchart of the binarized data map calculation process executed in the process shown in FIG. 12.
Figure 17:
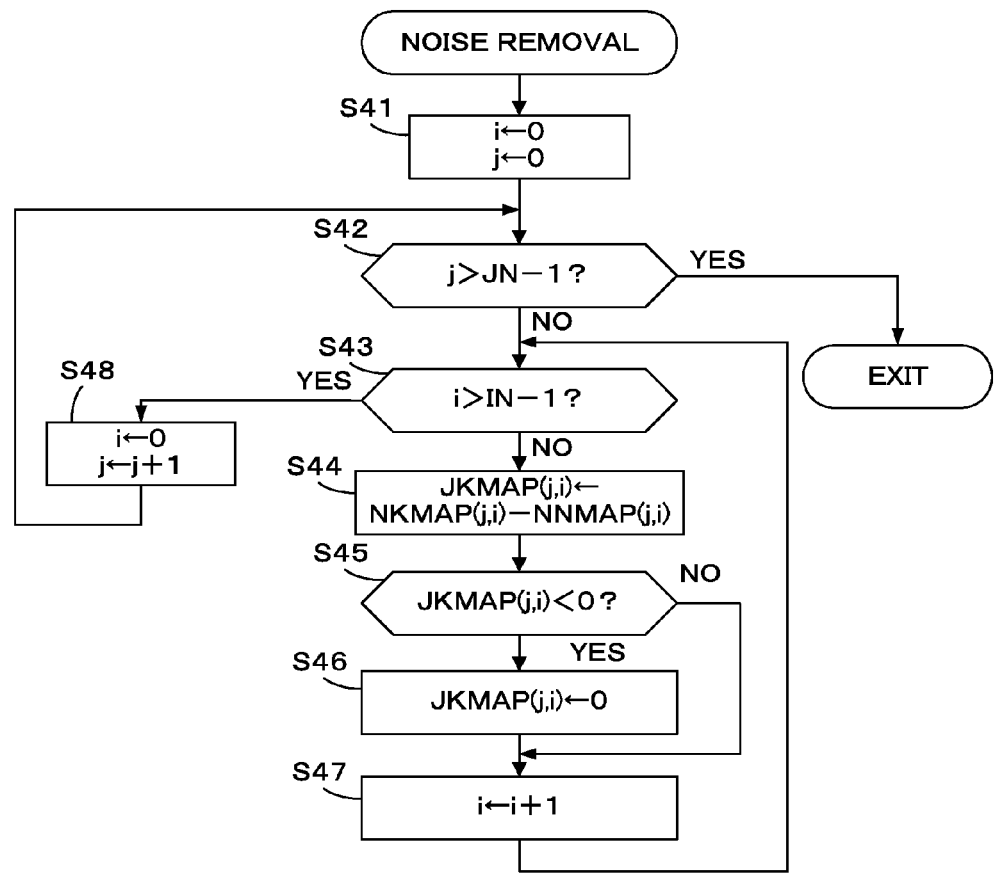
FIG. 17 is a flowchart of the noise removal process executed in the process shown in FIG. 12.

In step S11, the binarized data map calculation process shown in FIG. 14 is executed, to calculate the above-described binarized time series spectrum map. In step S12, the noise removal process shown in FIG. 17 is executed to remove noise components using the noise map shown in FIG. 9(a).

In step S13, the fitting ratio calculation process shown in FIG. 18 is executed, to calculate the fitting ratio PFIT using the binarized time series spectrum map from which the noise components are removed, and the master pattern map.

In step S14, a SLVL map which is set according to the engine rotational speed NE and the intake pressure PBA, for example, as shown in FIG. 13 is retrieved to calculate a determination threshold value SLVL. With respect to an operating point defined by the engine rotational speed NE and the intake pressure PBA other than the set points on the SLVL map, the determination threshold value SLVL is calculated by the interpolation.

In step S15, it is determined whether or not the fitting ratio PFIT calculated in step S13 is greater than the determination threshold value SLVL. If the answer to step S15 is affirmative (YES), it is determined that a knocking has occurred, and a knocking flag FKNOCK is set to "1" (step S16).

Figure 20:
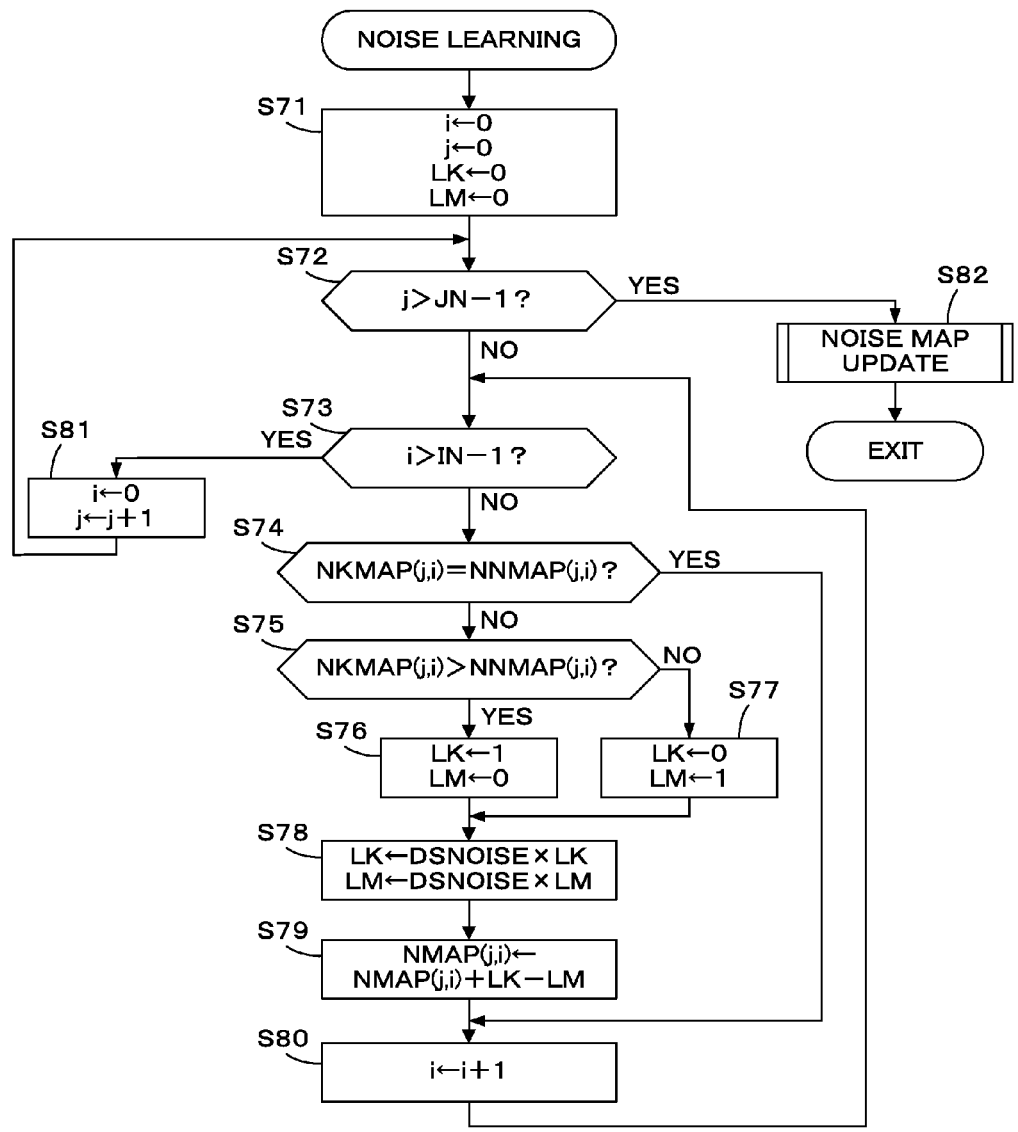
FIG. 20 is a flowchart of the noise learning process executed in the process shown in FIG. 12.

If PFIT is equal to or less than SLVL in step S15, it is determined that no knocking has occurred, and the knocking flag FKNOCK is set to "0" (step S17). Subsequently, in step S18, the noise learning process shown in FIG. 20 is executed to update the noise map (refer to FIG. 9(a)).

FIG. 14 is a flowchart of the binarized data map calculation process which is executed in step S11 of FIG. 12.

In step S21, the crank angle index i and the frequency index j are initialized to "0". In step S22, it is determined whether or not the frequency index j is greater than a value obtained by subtracting "1" from a frequency data number JN (the number JN is "21" in this embodiment). Since the answer to step S22 is initially negative (NO), the process proceeds to step S23, in which it is determined whether or not the crank angle index i is greater than a value obtained by subtracting "1" from a crank angle data number IN (the number IN is "15" in this embodiment).

Figure 15:
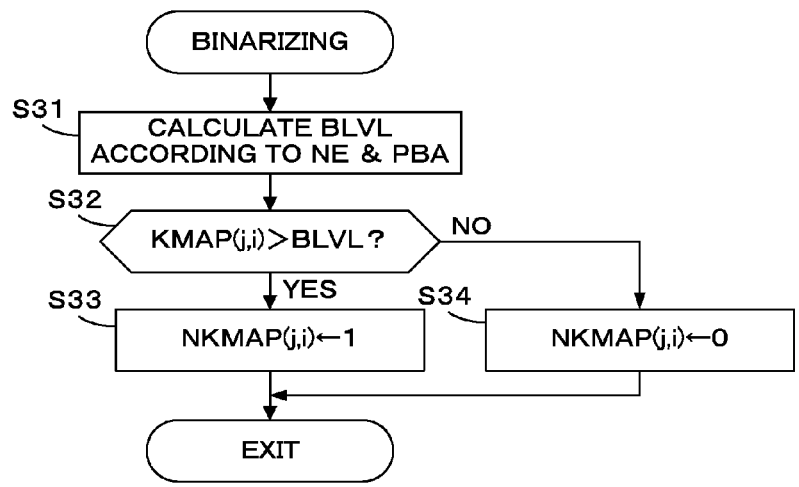
FIG. 15 is a flowchart of the binarizing process executed in the process shown in FIG. 14.

Since the answer to step S23 is also initially negative (NO), the intensity parameter KMAP(j,i) is set to the frequency component intensity STFT(j,i) stored in the memory (step S25). Next, the binarizing process shown in FIG. 15 is executed (step S26). In step S27, the crank angle index i is incremented by "1".

Figure 16:
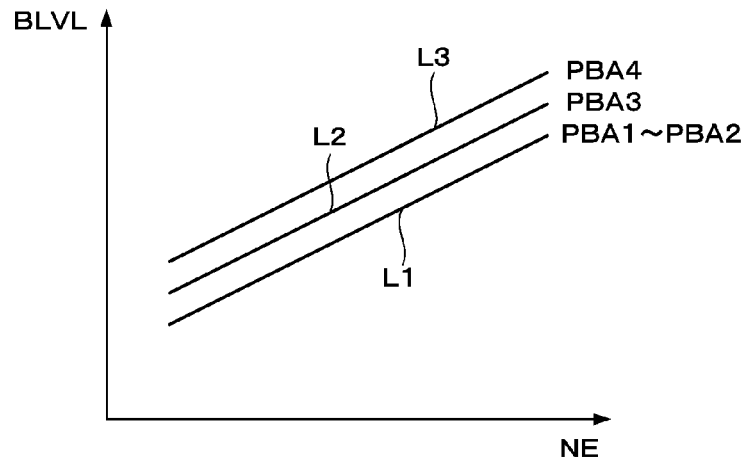
FIG. 16 is a diagram showing a map referred to in the process of FIG. 15.

In step S31 of FIG. 15, a BLVL map shown in FIG. 16 is retrieved according to the engine rotational speed NE and the intake pressure PBA, to calculate a binarizing threshold value BLVL. The BLVL map is set so that the binarizing threshold value BLVL increases as the engine rotational speed NE increases, and the binarizing threshold value BLVL also increases as the intake pressure PBA increases. The preset value shown by the line L1 is applied in a range from a first predetermined intake pressure PBA1 (i.e., 53 kPa (400 mmHg)) to a second predetermined intake pressure PBA2 (i.e., 80 kPa (600 mmHg)). The lines L2 and L3 respectively correspond to a third predetermined intake pressure PBA3 (i.e., 93 kPa (700 mmHg)) and a fourth predetermined intake pressure PBA4 (i.e., 107 kPa (800 mmHg)).

In step S32, it is determined whether or not the intensity parameter KMAP(j,i) is greater than the binarizing threshold value BLVL. If the answer to step S32 is affirmative (YES), the binarized intensity parameter NKMAP(j,i) is set to "1" (step S33). On the other hand, if KMAP(j,i) is equal to or less than BLVL in step S32, the binarized intensity parameter NKMAP(j,i) is set to "0" (step S34).

Referring back to FIG. 14, while the answer to step S23 is negative (NO), steps S25 to S27 are repeatedly executed. If the crank angle index i exceeds (IN−1), the process proceeds to step S28, in which the crank angle index i is reset to "0" and the frequency index j is incremented by "1". Thereafter, the process returns to step S22.

While the answer to step S22 is negative (NO), steps S23 to S28 are repeatedly executed. If the frequency index j exceeds (JN−1), the process ends.

According to the process of FIG. 14, the intensity parameter KMAP(j,i) on the time series spectrum map shown in FIG. 7(a) is set to the frequency component intensity STFT(j,i) which is obtained as a result of the frequency spectrum analysis and stored in the memory. Further, the intensity parameter KMAP(j,i) is binarized to calculate the binarized intensity parameter NKMAP(j,i). That is, the binarized time series spectrum map shown in FIG. 7(b) is generated.

FIG. 17 is a flowchart of the noise removal process executed in step S12 of FIG. 12.

In step S41, both of the crank angle index i and the frequency index j are initialized to "0". In step S42, it is determined whether or not the frequency index j is greater than a value obtained by subtracting "1" from the frequency data number JN. Since the answer to step S42 is initially negative (NO), the process proceeds to step S43, in which it is determined whether or not the crank angle index i is greater than a value obtained by subtracting "1" from the crank angle data number IN.

Since the answer to step S43 is also initially negative (NO), the binarized intensity parameter NKMAP(j,i) is corrected by the following equation (5), to calculate a corrected binarized intensity parameter JKMAP(j,i) in step S44. NNMAP(j,i) in the equation (2) is a binarized noise parameter on the noise map which is updated by the learning process.

$$JKMAP(j,i)=NKMAP(j,i)-NNMAP(j,i) \quad (5)$$

In step S45, it is determined whether or not the corrected binarized intensity parameter JKMAP(j,i) is less than "0". If the answer to step S45 is negative (NO), the process immediately proceeds to step S47. If JKMAP(j,i) is less than "0", JKMAP(j,i) is set to "0" (step S46), and the process proceeds to step S47.

In step S47, the crank angle index i is incremented by "1" and the process returns to step S43. While the answer to step S43 is negative (NO), steps S44 to S47 are repeatedly executed. If the crank angle index i exceeds (IN−1), the process proceeds to step S48, in which the crank angle index i is reset to "0" and the frequency index j is incremented by "1". Thereafter, the process returns to step S42. While the answer to step S42 is negative (NO), steps S43 to S48 are repeatedly executed. If the frequency index j exceeds (JN−1), the process ends.

According to the process of FIG. 17, the corrected binarized intensity parameter JKMAP(j,i) from which the noise is removed is obtained (refer to FIG. 9(b)).

FIG. 18 is a flowchart of the fitting ratio calculation process executed in step S13 of FIG. 12.

In step S51, the master pattern map is selected according to the engine rotational speed NE and the intake pressure PBA. In step S52, the weighting map is selected according to the engine rotational speed NE and the intake pressure PBA. The weighting map is provided for compensating changes in the frequency-dependent characteristic of the binarized time series spectrum map, depending on the engine operating condition. If the engine rotational speed NE or the intake pressure PBA (engine load) changes, the temperature in the combustion chamber changes, which causes a change in the binarized time series spectrum map. Therefore, by selecting the master pattern map and the weighting map according to the engine rotational speed NE and the intake pressure PBA, the determination can be performed accurately regardless of the changes in the engine operating condition.

In this embodiment, as shown in FIG. 19, nine master pattern maps and nine weighting maps are previously set corresponding to nine engine operating regions defined by the engine rotational speed NE and the intake pressure PBA. In step S51, one of the nine master pattern maps is selected, and in step S52, one of the nine weighting maps is selected. In FIG. 19, the low engine speed region is a region where the engine rotational speed NE is equal to or less than 2000 rpm, for example, the medium engine speed region is a region where the engine rotational speed NE is in the range from 2000 rpm to 4000 rpm, and the high engine speed region is a region where the engine rotational speed is higher than 4000 rpm. Further, the low engine load region is a region where the intake pressure PBA is equal to or less than 67 kPa (500 mmHg), for example, the medium engine load region is a region where the intake pressure PBA is in the range from 67 kPa to 93 kPa (700 mmHg), and the high engine load region is a region where the intake pressure PBA is higher than 93 kPa.

In step S53, both of the crank angle index i and the frequency index j are initialized to "0", and the intensity integrated value SUMK and the reference integrated value SUMM are initialized to "0". The intensity integrated value SUMK and the reference integrated value SUMM are updated in step S57 described below, and are applied to the calculation of the fitting ratio PFIT in step S60.

In step S54, it is determined whether or not the frequency index j is greater than a value obtained by subtracting "1" from the frequency data number JN. Since the answer to step S54 is initially negative (NO), the process proceeds to step S55, in which it is determined whether or not the crank angle index i is greater than a value obtained by subtracting "1" from the crank angle data number IN.

Since the answer to step S55 is also initially negative (NO), the process proceeds to step S56, in which a weighting master parameter MMW and a weighting product parameter KMW are calculated by the following equations (6) and (7). WMAP (j,i) in the following equations is a weighting parameter which is set in the weighting map. The weighting product parameter KMW is obtained by weighting the product of the master parameter MMAP(j,i) and the corrected binarized intensity parameter JKMAP(j,i) with the weighting parameter WMAP(j,i).

$$MMW = MMAP(j,i) \times WMAP(j,i) \quad (6)$$

$$KMW = MMAP(j,i) \times MMAP(j,i) \times JKMAP(j,i) \times WMAP(j,i) \quad (7)$$

In step S57, the weighting master parameter MMW and the weighting product parameter KMW are integrated with the following equations (8) and (9) to calculate the reference integrated value SUMM and the intensity integrated value SUMK.

$$SUMM = SUMM + MMW \quad (8)$$

$$SUMK = SUMK + KMW \quad (9)$$

In step S58, the crank angle index i is incremented by "1" and the process returns to step S55. While the answer to step S55 is negative (NO), steps S56 to S58 are repeatedly executed. If the crank angle index i exceeds (IN−1), the process proceeds to step S59, in which the crank angle index i is reset to "0" and the frequency index j is incremented by "1". Thereafter, the process returns to step S54. While the answer to step S54 is negative (NO), steps S55 to S59 are repeatedly executed. If the frequency index j exceeds (JN−1), the process proceeds to step S60, in which the fitting ratio PFIT is calculated by the following equation (10).

$$PFIT = SUMK/SUMM \quad (10)$$

FIG. 20 is a flowchart of the noise learning process executed in step S18 of FIG. 12.

In step S71, all of the crank angle index i, the frequency index j, an addition learning parameter LK, and a subtraction learning parameter LM are initialized to "0". In step S72, it is determined whether or not the frequency index j is greater than a value obtained by subtracting "1" from the frequency data number JN. Since the answer to step S72 is initially negative (NO), the process proceeds to step S73, in which it is determined whether or not the crank angle index i is greater than a value obtained by subtracting "1" from the crank angle data number IN.

Since the answer to step S73 is also initially negative (NO), the process proceeds to step S74, in which it is determined whether or not the binarized intensity parameter NKMAP(j,i) is equal to the binarized noise parameter NNMAP(j,i). If the answer to step S74 is affirmative (YES), the process immediately proceeds to step S80.

If the answer to step S74 is negative (NO), i.e., the binarized intensity parameter NKMAP(j,i) differs from the binarized noise parameter NNMAP(j,i), it is determined whether or not the binarized intensity parameter NKMAP(j,i) is greater than the binarized noise parameter NNMAP(j,i) (step S75). If the answer to step S75 is affirmative (YES), the addition learning parameter LK is set to "1" and the subtraction learning parameter LM is set to "0" (step S76). On the other hand, if NKMAP(j,i) is less than NNMAP(j,i), the addition learning parameter LK is set to "0" and the subtraction learning parameter LM is set to "1" (step S77).

In step S78, the addition learning parameter LK and the subtraction learning parameter LM are corrected with the following equations (11) and (12). DSNOISE in the equations (11) and (12) is a noise learning coefficient set to "0.1" for example.

$$LK = DSNOISE \times LK \quad (11)$$

$$LM = DNOISE \times LM \quad (12)$$

Figure 21:
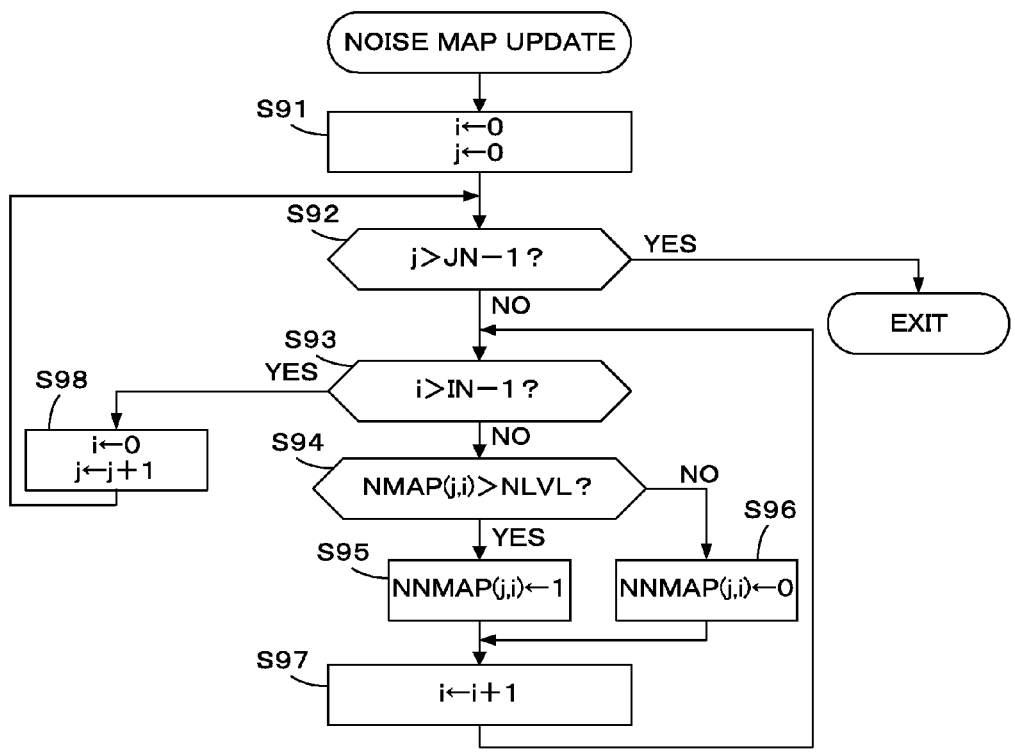
FIG. 21 is a flowchart of the noise map update process executed in the process shown in FIG. 20.

In step S79, the addition learning parameter LK and the subtraction learning parameter LM are applied to the following equation (13), to update the noise parameter NMAP(j,i). In the process of FIG. 21 described below, the noise parameter NMAP(j,i) is binarized to calculate the binarized noise parameter NNMAP(j,i).

$$NMAP(j,i) = NMAP(j,i) + LK - LM \quad (13)$$

In step S80, the crank angle index i is incremented by "1" and the process returns to step S73. While the answer to step S73 is negative (NO), steps S74 to S80 are repeatedly executed. If the crank angle index i exceeds (IN−1), the process proceeds to step S81, in which the crank angle index i is reset to "0" and the frequency index j is incremented by "1". Thereafter, the process returns to step S72. While the answer to step S72 is negative (NO), steps S73 to S81 are repeatedly executed. If the frequency index j exceeds (JN−1), the process proceed to step S82, in which the noise map update process shown in FIG. 21 is executed.

In step S91 of FIG. 21, both of the crank angle index i and the frequency index j are initialized to "0". In step S92, it is determined whether or not the frequency index j is greater than a value obtained by subtracting "1" from the frequency data number JN. Since the answer to step S92 is initially negative (NO), the process proceeds to step S93, in which it is determined whether or not the crank angle index i is greater than a value obtained by subtracting "1" from the crank angle data number IN.

Since the answer to step S93 is also initially negative (NO), the process proceeds to step S94, in which it is determined whether or not the noise parameter NMAP(j,i) is greater than a noise binarizing threshold value NLVL (e.g., 0.8). If the answer to step S94 is affirmative (YES), the binarized noise parameter NNMAP(j,i) is set to "1" (step S95). On the other hand, if NMAP(j,i) is equal to or less than NLVL, the binarized noise parameter NNMAP(j,i) is set to "0" (step S96).

In step S97, the crank angle index i is incremented by "1" and the process returns to step S93. While the answer to step S93 is negative (NO), steps S94 to S97 are repeatedly executed. If the crank angle index i exceeds (IN−1), the process proceeds to step S98, in which the crank angle index i is reset to "0" and the frequency index j is incremented by "1". Thereafter, the process returns to step S92. While the answer to step S92 is negative (NO), steps S93 to S98 are repeatedly executed. If the frequency index j exceeds (JN−1), the process ends.

If NKMAP(j,i) is greater than NNMAP(j,i) in step S75 of FIG. 20, LK is updated to "0.1" and LM is updated to "0" in step S78, and the noise parameter NMAP(j,i) is incremented by "0.1" with the equation (9). On the other hand, if NKMAP (j,i) is less than NNMAP(j,i) in step S75, LK is updated to "0" and LM is updated to "0.1" in step S78, and the noise parameter NMAP(j,i) is decremented by "0.1" with the equation (13). In the process of FIG. 21, when the noise parameter NMAP(j,i) is greater than the noise binarizing threshold value NLVL, the binarized noise parameter NNMAP(j,i) is set to "1". On the other hand, when the noise parameter NMAP(j,i) is equal to or less than the noise binarizing threshold value NLVL, the binarized noise parameter NNMAP(j,i) is set to "0".

By the processes of FIGS. 20 and 21, the noise map is updated according to the binarized intensity parameter NKMAP(j,i) which is obtained when it is determined that no knocking has occurred. The steadily-generated noise, such as the seating noise of the intake valve, is reflected on the noise map. Consequently, it is possible to accurately perform the determination without influence of the noise.

It is to be noted that the fitting ratio PFIT may be calculated using the binarized intensity parameter NKMAP itself without performing the noise removal process (FIG. 12, step S12). When not performing the noise removal process, the possibility of being influenced by the noises becomes comparatively high. However, the knocking can be determined distinctively from the noise as described with reference to FIG. 19.

As described above, in this embodiment, the frequency spectrum analysis of the output signal of the knock sensor 11 is performed at intervals of six degrees of the crank angle. Consequently, the time series data of the intensity of the frequency components from 5 kHz to 25 kHz are obtained, and the time series spectrum map is generated. That is, the elements of the time series spectrum map are stored in the memory as the intensity parameters KMAP(j,i) which are two-dimension array data. Subsequently, by binarizing the intensity parameter KMAP(j,i), the binarized intensity parameter NKMAP(j,i) is calculated, and it is determined whether or not a knocking has occurred based on the binarized intensity parameter NKMAP(j,i). The change in the frequency spectrum occurring with the engine rotation is reflected on the binarized intensity parameter NKMAP(j,i). Therefore, by comparing the binarized intensity parameter NKMAP(j,i) with the master parameter MMAP(j,i) on the master pattern map which corresponds to the changing pattern particular to occurrence of the knocking, occurrence of the knocking can be accurately determined. Further, by binarizing the intensity parameter KMAP(j,i) obtained as a result of the frequency spectrum analysis, the amount of data is reduced and the changing pattern of the time series data is simplified. Consequently, the memory capacity can be reduced and the computing speed can be raised.

Further, the possibility that a knocking has occurred is high when the binarized intensity parameter NKMAP(j,i) (JKMAP (j,i)) indicates a changing pattern similar to the master parameter MMAP(j,i). Therefore, by calculating a parameter which indicates the similarity (correlativity) between the binarized intensity parameter NKMAP(j,i) (JKMAP(j,i)) and the master parameter MMAP(j,i), the determination can be performed accurately.

In this embodiment, the fitting ratio PFIT is used as the parameter indicative of the similarity (correlativity), and it is determined that a knocking has occurred when the fitting ratio PFIT exceeds the determination threshold value SLVL. By using the fitting ratio PFIT, the similarity (correlativity) between the binarized intensity parameter NKMAP(j,i) (JKMAP(j,i)) and the master parameter MMAP(j,i) can be accurately estimated with comparatively easy calculation, and the determination can be performed accurately.

Further, the time series data NNMAP(j,i) of noise components are calculated based on the binarized intensity parameter NKMAP(j,i). The binarized intensity parameter NKMAP(j,i) is corrected by the noise parameter NNMAP(j,i), and the knocking determination is performed based on the corrected binarized intensity parameter JKMAP(j,i). Therefore, the noise components which steadily appear, e.g., the components included in the above-described valve seating noise, are removed to make it possible to accurately perform the determination.

Further, the fitting ratio PFIT is calculated using the parameters obtained by multiplying the binarized intensity parameter NKMAP(j,i)(JNKMAP (j,i)) and the master parameter MMAP (j,i) by the weighting parameter WMAP(j,i) set according to the frequency. The frequency components which become greater when a knocking has occurred are previously known. Therefore, by largely weighting the data corresponding to frequencies near the frequencies of the known frequency components, accuracy of the determination can be improved.

In this embodiment, the ECU 5 constitutes the sampling means, the element intensity calculating means, and the frequency component intensity calculating means.

The present invention is not limited to the embodiment described above, and various modifications may be made. For example, the sampling period of the knock sensor output and the crank angle interval of the frequency spectrum analysis is not limited to the above-described time period and angular interval (20 microseconds, 6 degrees). The time period and/or the angular interval can be changed within the range in which the objective of the present invention is attained. Further, the configuration of the binarized time series spectrum map (which is configured in the form of the matrix of 21 lines×15 columns in the described-above embodiment) can be changed similarly.

Further, in the above-described embodiment, an apparatus for performing a frequency spectrum analysis of the detected value of the knock sensor is shown. The present invention is applicable to performing a frequency spectrum analysis with respect to the detected value of the engine operating parameter in synchronism with rotation of the engine (the CRK interrupt). For example, the present invention is applicable to a frequency spectrum analysis with respect to the generation period CRME of the CRK pulse (interrupt) output from the CRK sensor, or an instantaneous rotational speed of the engine 1 which is obtained as a reciprocal of the generation period CRME.

Further, in the above-described embodiment, the threshold value NETH of the engine rotational speed NE is set to the step number saturation rotational speed NESAT at which the calculation step number per unit time reaches the saturation point. Alternatively, the threshold value NETH may be set to a rotational speed NETS at which the sampling period TS applied to sampling data used for calculating the frequency component intensities becomes equal to the occurrence period CRME of the CRK interrupt, or set to a rotational speed which is slightly higher (e.g., by 100 rpm) than the rotational speed NETS. In the above-described embodiment, the rotational speed NETS is 1000 rpm.

Further, in the above-described first embodiment, the fitting ratio PFIT is calculated using the parameters obtained by multiplying the binarized intensity parameter NKMAP (j,i) and the master parameter MMAP (j,i) by the weighting parameter WMAP(j,i). Alternatively, the fitting ratio PFIT may be calculated with the binarized intensity parameter NKMAP (j,i) and the master parameter MMAP (j,i) without multiplying the weighting parameter WMAP(j,i), i.e., without performing the weighting.

Further, in the above-described embodiments, the determination threshold value SLVL, the binarizing threshold value BLVL, the master pattern map, and the weighting map are calculated or selected according to the engine rotational speed NE and the intake pressure PBA. Alternatively, the determination threshold value SLVL, the binarizing threshold value BLVL, the master pattern map, and/or the weighting map are fixed to a previously set value or one map.

DESCRIPTION OF REFERENCE NUMERALS

1 Internal combustion engine
5 Electronic control unit (sampling means, element intensity calculating means, frequency component intensity calculating means)
11 Knock sensor

We claim:

1. A frequency spectrum analyzing apparatus for performing a frequency spectrum analysis with respect to a detected value of an operating parameter of an internal combustion engine in synchronism with rotation of said engine, said frequency spectrum analyzing apparatus by comprising:
sampling means for sampling the operating parameter at predetermined time intervals, and converting a sampled value to a digital value;
element intensity calculating means for calculating intensities of first and second elements with respect to a predetermined number of the sampled values, wherein the first and second elements respectively correspond to a plurality of frequency components contained in the detected value, and a phase of the second element differs from a phase of the first element by 90 degrees; and
frequency component intensity calculating means for calculating frequency component intensities corresponding to the plurality of frequency components in synchronism with rotation of said engine, using the first element intensities and the second element intensities,
wherein said frequency component intensity calculating means calculates the frequency component intensities by replacing a part of an integrated value of the first element intensities, and a part of an integrated value of the second element intensities respectively with corresponding preceding calculated values, when an rotational speed of said engine is higher than or equal to a set threshold value.

2. A frequency spectrum analyzing apparatus according to claim 1, wherein the set threshold value is set according to a time period which is necessary for obtaining the predetermined number of the sampled values.

3. A frequency spectrum analyzing apparatus according to claim 1, wherein the set threshold value is set according to a number of steps per unit time which are necessary for calculating the frequency component intensities.

4. A frequency spectrum analyzing apparatus according to claim 1, wherein said frequency component intensity calculating means calculates the frequency component intensities using sampled values which are obtained in a predetermined time period, the center of the predetermined time period being a timing at which a trigger signal is generated in synchronism with rotation of said engine.

5. A frequency spectrum analyzing method for performing a frequency spectrum analysis with respect to a detected value of an operating parameter of an internal combustion engine in synchronism with rotation of said engine, said method comprising:
a) sampling the operating parameter at predetermined time intervals, and converting a sampled value to a digital value;
b) calculating intensities of first and second elements with respect to a predetermined number of the sampled values, the first elements and second elements respectively corresponding to a plurality of frequency components contained in the detected value, a phase of the second element differing from a phase of the first element by 90 degrees; and
c) calculating frequency component intensities corresponding to the plurality of frequency components in synchronism with rotation of said engine, using the first element intensities and the second element intensities,
wherein the frequency component intensities are calculated by replacing a part of an integrated value of the first element intensities, and a part of an integrated value of the second element intensities respectively with corresponding preceding calculated values, when an rotational speed of said engine is higher than or equal to a set threshold value.

6. A frequency spectrum analyzing method according to claim 5, wherein the set threshold value is set according to a time period which is necessary for obtaining the predetermined number of the sampled values.

7. A frequency spectrum analyzing method according to claim 5, wherein the set threshold value is set according to a number of steps per unit time which are necessary for calculating the frequency component intensities.

8. A frequency spectrum analyzing method according to claim 5, wherein the frequency component intensities are calculated using sampled values which are obtained in a predetermined time period, the center of the predetermined time period being a timing at which a trigger signal is generated in synchronism with rotation of said engine.

* * * * *